US012785269B2

(12) United States Patent
Song et al.

(10) Patent No.: US 12,785,269 B2
(45) Date of Patent: Nov. 3, 2026

(54) ANTENNA FILTER UNIT, RADIO UNIT, AND COMMUNICATION DEVICE

(71) Applicant: Telefonaktiebolaget LM Ericsson (publ), Stockholm (SE)

(72) Inventors: Juandi Song, Beijing (CN); Guangfeng Liu, Beijing (CN)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 205 days.

(21) Appl. No.: 18/712,886

(22) PCT Filed: Nov. 29, 2021

(86) PCT No.: PCT/CN2021/134060
§ 371 (c)(1),
(2) Date: May 23, 2024

(87) PCT Pub. No.: WO2023/092567
PCT Pub. Date: Jun. 1, 2023

(65) Prior Publication Data

US 2025/0023235 A1 Jan. 16, 2025

(51) Int. Cl.

| | |
|---|---|
| ***H01Q 3/38*** | (2006.01) |
| ***H01P 1/18*** | (2006.01) |
| ***H03H 7/21*** | (2006.01) |

(52) U.S. Cl.
CPC ................. *H01Q 3/38* (2013.01); *H01P 1/18* (2013.01); *H03H 7/21* (2013.01)

(58) Field of Classification Search
CPC ............... H01Q 3/38; H01P 1/18; H03H 7/21
USPC .......................................................... 342/368
See application file for complete search history.

(56) References Cited

U.S. PATENT DOCUMENTS

| | | | |
|---|---|---|---|
| 11,201,397 B2 * | 12/2021 | Kaho | H01P 3/081 |
| 11,956,027 B2 * | 4/2024 | Abdelmonem | H01Q 1/002 |
| 2004/0162042 A1 | 8/2004 | Chen et al. | |
| 2021/0203061 A1 | 7/2021 | Gerlinger et al. | |

FOREIGN PATENT DOCUMENTS

| | | | |
|---|---|---|---|
| CN | 1507163 A | | 6/2004 |
| CN | 203690450 U | * | 7/2014 |
| CN | 111758181 A | | 10/2020 |

(Continued)

OTHER PUBLICATIONS

International Search Report and Written Opinion of the International Searching Authority, PCT/CN2021/134060, mailed Aug. 17, 2022, 10 pages.

(Continued)

*Primary Examiner* — Harry K Liu
(74) *Attorney, Agent, or Firm* — Sage Patent Group

(57) ABSTRACT

The present disclosure is related to an antenna filter unit (AFU), a radio unit (RU), and a communication device including the same. The AFU includes: one or more antenna elements; a first digital phase shifter communicatively coupled to at least a first antenna element of the one or more antenna elements, and configured to shift a phase of a first signal that is to be transmitted by the first antenna element; and a first IM filtering module communicatively coupled between the first digital phase shifter and the first antenna element, and configured to filter out an IM component from the first signal and output the filtered first signal.

20 Claims, 13 Drawing Sheets

(56) References Cited

FOREIGN PATENT DOCUMENTS

| | | | |
|---|---|---|---|
| CN | 112151964 | A | 12/2020 |
| EP | 3758134 | A1 | 12/2020 |
| EP | 4391229 | A1 | 6/2024 |
| WO | 2021061297 | A1 | 4/2021 |
| WO | 2021127049 | A1 | 6/2021 |

OTHER PUBLICATIONS

Extended European Search Report for European Patent Application No. 21965297.1 dated Jul. 4, 2025, 9 pages.

* cited by examiner (a)

(b)

(c)

(a)

(b)

(c)

ANTENNA FILTER UNIT, RADIO UNIT, AND COMMUNICATION DEVICE

CROSS REFERENCE TO RELATED APPLICATIONS

This application is a 35 U.S.C. § 371 national stage application of PCT International Application No. PCT/CN2021/134060 filed on Nov. 29, 2021, the disclosure and content of which is incorporated by reference herein in its entirety.

TECHNICAL FIELD

The present disclosure is related to the field of telecommunications, and in particular, to an antenna filter unit (AFU), a radio unit (RU), and a communication device comprising the AFU or the RU.

BACKGROUND

With the development of the electronic and telecommunications technologies, mobile devices, such as mobile phones, smart phones, laptops, tablets, vehicle mounted devices, become an important part of our daily lives. To support a numerous number of mobile devices, an efficient Radio Access Network (RAN), such as a fifth generation (5G) New Radio (NR) RAN, will be required.

Multiple input multiple output (MIMO) and beamforming are essential technologies to achieve IMT-2020 vision goals for 5G. They increase capacity and coverage in a cell to enable 100× faster data rates and 1000× more capacity than 4G.

Deployed with massive MIMO, multi-user MIMO (MU-MIMO) uses multiple antennas to transmit data to multiple users, thereby increasing cell capacity. Using MU-MIMO, 5G will transition from cell-based communications to beam-based communications. Beamforming is a special implementation of MIMO that uses multi-element antenna arrays to dynamically control the beam pattern. It applies specific spacing and phase/amplitude shifts between the antenna elements.

As the number of antenna elements increase, the radiated energy becomes more focused, resulting in increased power delivery and signal-to-noise ratio (SNR) to the user. By applying a phase shift to the signal at each element, it is possible to change the direction of the beam away from an orthogonal orientation to the arrays. Through control of the phase shifts, electronic phase shifting enables rapid beam control without mechanical operation. The focused beams in beamforming maximize the user equipment's (UE) SNR, improving the communication link for higher modulation coding schemes.

Beamforming uses channel-state information (CSI) to calculate specific weightings for each antenna element. It applies real-time changes to optimize the signal for the target UE. The UE, in turn, identifies the channel characteristics and shares this information with the base station. The base station can change the phase and amplitude of the antenna elements to counter the effects of the channel conditions. This process offers better control of the transmitted signal. The signal is strongest for the intended UE, improving cell coverage.

Therefore, one or more phase shifters are typically required for beamforming or MU-MIMO technologies. Phase shifters can be controlled using analog signals or digital bits. Analog phase shifters provide a continuously variable phase, most often controlled by a voltage. Electrically controlled analog phase shifters can be realized with varactor diodes that change capacitance with voltage, or nonlinear dielectrics such as barium strontium titanate, or ferro-electric materials such as yttrium iron garnet.

Most phase shifters are of the digitally controlled variety, i.e., digital phase shifters, because they are more immune to noise on their voltage control lines. Digital phase shifters provide a discrete set of phase states that are controlled by two-state "phase bits". In some configurations, the highest order bit indicates 180 degrees, the next highest indicates 90 degrees, then 45 degrees, etc., as 360 degrees are divided into smaller and smaller binary steps. A three bit phase shifter would have a 45 degree least significant bit (LSB), while a six bit phase shifter would have a 5.625 degree least significant bit.

SUMMARY

According to a first aspect of the present disclosure, an AFU is provided. The AFU comprises: one or more antenna elements; a first digital phase shifter communicatively coupled to at least a first antenna element of the one or more antenna elements, and configured to shift a phase of a first signal that is to be transmitted by the first antenna element; and a first intermodulation (IM) filtering module communicatively coupled between the first digital phase shifter and the first antenna element, and configured to filter out an IM component from the first signal and output the filtered first signal.

In some embodiments, the AFU further comprises: a first band-pass filter (BPF) communicatively coupled to the first digital phase shifter and disposed at an upstream location relative to the first digital phase shifter in a transmission direction, and configured to filter out any signal having a frequency outside of a desired operating frequency range of the first antenna element. In some embodiments, the first IM filtering module is further configured to filter out any signal having a frequency outside of a desired operating frequency range of the first antenna element. In some embodiments, the one or more antenna elements further comprise a second antenna element that is not communicatively coupled to any digital phase shifter, and configured to radiate the first signal that is not phase shifted by any digital phase shifter. In some embodiments, the AFU further comprises: a second BPF communicatively coupled to the second antenna element, and configured to filter out any signal having a frequency outside of a desired operating frequency range of the second antenna element.

In some embodiments, the first antenna element is communicatively coupled to the first IM filtering module and configured to radiate the filtered first signal that is received from the first IM filtering module. In some embodiments, the one or more antenna elements form a phased array for beamforming. In some embodiments, the first IM filtering module provides Electromagnetic Compatibility (EMC) shielding for the first digital phase shifter.

In some embodiments, the AFU further comprises an antenna board on which the one or more antenna elements are disposed. In some embodiments, the first digital phase shifter and the first IM filtering module are disposed on a surface of the antenna board that is opposite to the surface on which the one or more antenna elements are disposed. In some embodiments, an EMC shielding part houses both of the first IM filtering module and the first digital phase shifter and provides EMC shielding for both of the first IM filtering module and the first digital phase shifter. In some embodiments, a housing of the first IM filtering module also houses the first digital phase shifter and provides EMC shielding for both of the first digital phase shifter and the first IM filtering module.

In some embodiments, the first digital phase shifter comprises: one or more switches; and multiple phase shifting elements, each being communicatively coupled to at least one of the switches and configured to shift a phase of a signal passing therethrough under the control of the at least one switch. In some embodiments, the one or more switches comprise a first switch and a second switch, wherein the multiple phase shifting elements are coupled in parallel between the first switch and the second switch, and each of the phase shifting elements is able to shift the phase of the first signal independently of other phase shifting elements, wherein the first switch and the second switch are configured to cooperate such that only one of the phase shifting elements is used for phase shifting the signal at a time. In some embodiments, the one or more switches comprise a third switch, wherein the multiple phase shifting elements are coupled in series and the third switch is coupled to a reference point between each pair of consecutive phase shifting elements, wherein the third switch is configured to control the multiple phase shifting elements such that a signal that is phase shifted by a certain phase shifting element is also phase shifted by all phase shifting elements that are coupled in series before the certain phase shifting element.

In some embodiments, each of the phase shifting elements is a trace. In some embodiments, each of the traces has a different length than those of other traces. In some embodiments, the first IM filtering module comprises at least one of: a metal cavity filter; a ceramic waveguide filter; a surface acoustic wave (SAW) filter; a bulk acoustic wave (BAW) filter; and a film bulk acoustic resonator (FBAR) filter.

In some embodiments, the AFU further comprises: a power divider network configured to divide a signal and output the divided signals via at least two paths, the at least two paths comprising a first path to the first digital phase shifter and a second path to the second antenna element.

According to a second aspect of the present disclosure, an RU is provided. The RU comprises: a first digital phase shifter communicatively coupled to at least a first antenna element of one or more antenna elements, and configured to shift a phase of a first signal that is to be transmitted by a first antenna element; and a first IM filtering module communicatively coupled between the first digital phase shifter and the first antenna element, and configured to filter out an IM component from the first signal, and output the filtered first signal.

In some embodiments, the RU further comprises: a first BPF communicatively coupled to the first digital phase shifter and disposed at an upstream location relative to the first digital phase shifter in a transmission direction, and configured to filter out any signal having a frequency outside of a desired operating frequency range of the first antenna element. In some embodiments, the first IM filtering module is further configured to filter out any signal having a frequency outside of a desired operating frequency range of the first antenna element.

In some embodiments, the one or more antenna elements further comprise a second antenna element that is not communicatively coupled to any digital phase shifter, and configured to radiate the first signal that is not phase shifted by any digital phase shifter. In some embodiments, the RU further comprises: a second BPF communicatively coupled to the second antenna element, and configured to filter out any signal having a frequency outside of a desired operating frequency range of the second antenna element.

In some embodiments, the first antenna element is communicatively coupled to the first IM filtering module and configured to radiate the filtered first signal that is received from the first IM filtering module. In some embodiments, the one or more antenna elements form a phased array for beamforming. In some embodiments, the first IM filtering module provides EMC shielding for the first digital phase shifter. In some embodiments, the first digital phase shifter and the first IM filtering module are disposed on a PCB that is separated from an antenna board on which the one or more antenna elements are disposed. In some embodiments, an EMC shielding part houses both of the first IM filtering module and the first digital phase shifter and provides EMC shielding for both of the first IM filtering module and the first digital phase shifter.

In some embodiments, a housing of the first IM filtering module also houses the first digital phase shifter and provides EMC shielding for both of the first digital phase shifter and the first IM filtering module. In some embodiments, the RU further comprises a connection that is communicatively coupled between the antenna board and the PCB, such that the first digital phase shifter and/or the first IM filtering module can communicate with the first antenna element via the connection.

In some embodiments, the connection is disposed outside of the housing that houses the first IM filtering module, and communicatively coupled to the first IM filtering module via a path in or on the PCB. In some embodiments, the connection is disposed to penetrate through the housing that houses the first IM filtering module and contact the first IM filtering module, and communicatively coupled to the first IM filtering module directly. In some embodiments, the connection is disposed to contact the housing of the first IM filtering module, and communicatively coupled to the first IM filtering module directly.

In some embodiments, the first digital phase shifter comprises: one or more switches; and multiple phase shifting elements, each being communicatively coupled to at least one of the switches and configured to shift a phase of a signal passing therethrough under the control of the at least one switch. In some embodiments, the one or more switches comprise a first switch and a second switch, wherein the multiple phase shifting elements are coupled in parallel between the first switch and the second switch, and each of the phase shifting elements is able to shift the phase of the first signal independently of other phase shifting elements, wherein the first switch and the second switch are configured to cooperate such that only one of the phase shifting elements is used for phase shifting the signal at a time. In some embodiments, the one or more switches comprise a third switch, wherein the multiple phase shifting elements are coupled in series and the third switch is coupled to a reference point between each pair of consecutive phase shifting elements, wherein the third switch is configured to control the multiple phase shifting elements such that a signal that is phase shifted by a certain phase shifting element is also phase shifted by all phase shifting elements that are coupled in series before the certain phase shifting element.

In some embodiments, each of the phase shifting elements is a trace. In some embodiments, each of the traces has a different length than those of other traces. In some embodiments, the first IM filtering module comprises at least one of: a metal cavity filter; a ceramic waveguide filter; a SAW filter; a BAW filter; and an FBAR filter. In some embodiments, the RU further comprises: a power divider network configured to divide a signal and output the divided signals via at least two paths, the at least two paths comprising a first path to the first digital phase shifter and a second path to the second antenna element.

According to a third aspect of the present disclosure, a communication device comprising an AFU of the first aspect or an RU of the second aspect is provided.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and therefore are not to be considered limiting of its scope, the disclosure will be described with additional specificity and detail through use of the accompanying drawings.

DETAILED DESCRIPTION

Figure 1:
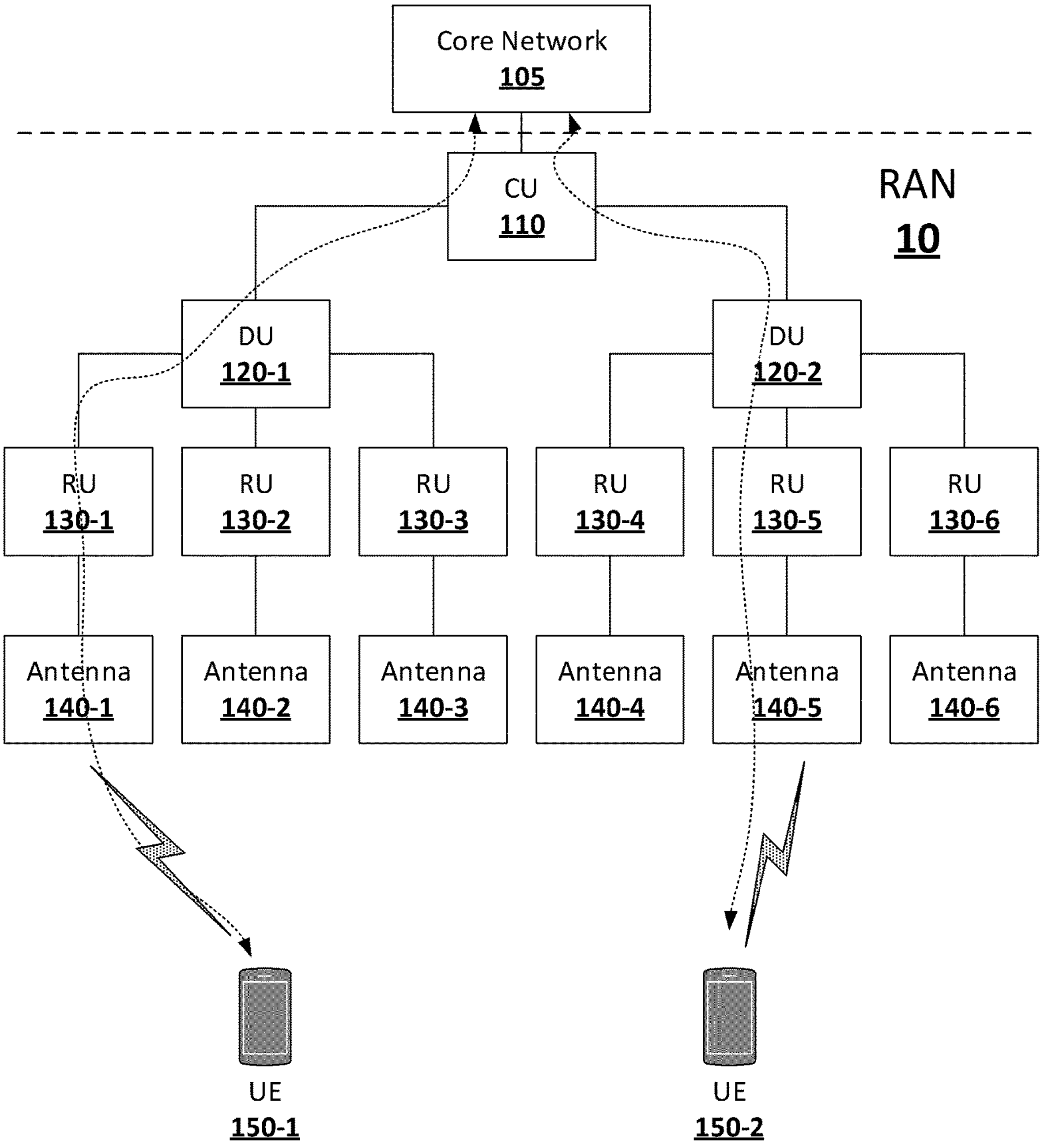
FIG. 1 is a diagram illustrating an exemplary RAN in which IM filtering according to an embodiment of the present disclosure may be applicable.

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

Those skilled in the art will appreciate that the term "exemplary" is used herein to mean "illustrative," or "serving as an example," and is not intended to imply that a particular embodiment is preferred over another or that a particular feature is essential. Likewise, the terms "first", "second", "third", "fourth," and similar terms, are used simply to distinguish one particular instance of an item or feature from another, and do not indicate a particular order or arrangement, unless the context clearly indicates otherwise. Further, the term "step," as used herein, is meant to be synonymous with "operation" or "action." Any description herein of a sequence of steps does not imply that these operations must be carried out in a particular order, or even that these operations are carried out in any order at all, unless the context or the details of the described operation clearly indicates otherwise.

Conditional language used herein, such as "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The term "based on" is to be read as "based at least in part on." The term "one embodiment" and "an embodiment" are to be read as "at least one embodiment." The term "another embodiment" is to be read as "at least one other embodiment." Other definitions, explicit and implicit, may be included below. In addition, language such as the phrase "at least one of X, Y and Z," unless specifically stated otherwise, is to be understood with the context as used in general to convey that an item, term, etc. may be either X, Y, or Z, or a combination thereof.

The terminology used herein is for the purpose of describing particular embodiments only and is not intended to be limitation of example embodiments. As used herein, the singular forms "a", "an", and "the" are intended to include the plural forms as well, unless the context clearly indicates otherwise. It will be further understood that the terms "comprises", "comprising", "has", "having", "includes" and/or "including", when used herein, specify the presence of stated features, elements, and/or components etc., but do not preclude the presence or addition of one or more other features, elements, components and/or combinations thereof. It will be also understood that the terms "connect(s)," "connecting", "connected", etc. when used herein, just mean that there is an electrical or communicative connection between two elements and they can be connected either directly or indirectly, unless explicitly stated to the contrary.

Of course, the present disclosure may be carried out in other specific ways than those set forth herein without departing from the scope and essential characteristics of the disclosure. One or more of the specific processes discussed below may be carried out in any electronic device comprising one or more appropriately configured processing circuits, which may in some embodiments be embodied in one or more application-specific integrated circuits (ASICs). In some embodiments, these processing circuits may comprise one or more microprocessors, microcontrollers, and/or digital signal processors programmed with appropriate software and/or firmware to carry out one or more of the operations described above, or variants thereof. In some embodiments, these processing circuits may comprise customized hardware to carry out one or more of the functions described above. The present embodiments are, therefore, to be considered in all respects as illustrative and not restrictive.

Although multiple embodiments of the present disclosure will be illustrated in the accompanying Drawings and described in the following Detailed Description, it should be understood that the disclosure is not limited to the disclosed embodiments, but instead is also capable of numerous rearrangements, modifications, and substitutions without departing from the present disclosure that as will be set forth and defined within the claims.

Further, please note that although the following description of some embodiments of the present disclosure is given in the context of 5G NR, the present disclosure is not limited thereto. In fact, as long as IM filtering is involved, the inventive concept of the present disclosure may be applicable to any appropriate communication architecture, for example, to Global System for Mobile Communications (GSM)/General Packet Radio Service (GPRS), Enhanced Data Rates for GSM Evolution (EDGE), Code Division Multiple Access (CDMA), Wideband CDMA (WCDMA), Time Division-Synchronous CDMA (TD-SCDMA), CDMA2000, Worldwide Interoperability for Microwave Access (WiMAX), Wireless Fidelity (Wi-Fi), 4th Generation Long Term Evolution (LTE), LTE-Advance (LTE-A), or 5G NR, etc.

Therefore, one skilled in the arts could readily understand that the terms used herein may also refer to their equivalents in any other infrastructure. For example, the term “User Equipment” or “UE” used herein may refer to a terminal device, a mobile device, a mobile terminal, a mobile station, a user device, a user terminal, a wireless device, a wireless terminal, or any other equivalents. For another example, the term “network node” used herein may refer to a network function, a network element, a RAN node, an OAM node, a testing network function, a transmission reception point (TRP), a base station, a base transceiver station, an access point, a hot spot, a NodeB, an Evolved NodeB (eNB), a gNB, a network element, or any other equivalents. Further, please note that the term “indicator” used herein may refer to a parameter, a coefficient, an attribute, a property, a setting, a configuration, a profile, an identifier, a field, one or more bits/octets, an information element, or any data by which information of interest may be indicated directly or indirectly.

Further, the expression “A is communicatively coupled to B” used herein may refer to that A may be coupled to B mechanically, electrically, optically, electro-magnetically or in any other manner, either directly or indirectly, such that A can communicate with B or a signal output from A may arrive or be detected at B, or vice versa.

Phase shifters are widely used in an antenna system of a base station which may include Remote Electrical Tilting (RET) to realize the beam scan function. In current radio products, phase shifters may be achieved by changing the length of transmission line or changing the dielectric constant. At least one motor may be needed to drive a mechanical part to achieve the length or dielectric changes (e.g., as shown in (a) of FIG. 12), in order to change the phase. Further, additional shielding parts may be needed to shield the transmission line. Therefore, long transmission lines, shielding parts, one or more motors for mechanical driving, and other functions may occupy a very large area or space. Therefore, an antenna system with RET, or Advanced Antenna System (AAS) radio with this kind of antenna is always large and heavy.

Digital or electrical RETs have been studied in recent years, which may use one or more power switches to achieve a discontinuous phase shift. By using a digital or electrical RET, the RET function can be achieved by a similar antenna system that greatly reduces the antenna and radio size, weight, and cost.

However, one of disadvantages of this kind solution is that switches in the market cannot fulfill some Radio Frequency (RF) requirements of current AAS antenna system, especially the requirement for Passive Intermodulation (PIM). Even for Time Division Duplex (TDD), only a portion of antennas & radios, which have a loose PIM requirement and low output power, can use this kind of solution. With the increase of radio output power, the PIM issue becomes worse. A power switch with good PIM performance is needed but cannot be achieved.

Therefore, some embodiments of the present disclosure may propose an AFU system or radio system, in which a filter may be used to reject or cancel an intermodulation of the power switch, for example, those comprised in a digital phase shifter. In this way, the switch may be used in an AFU or radio product with a strict PIM requirement. In some embodiments, the filters can also provide EMC shielding for the switch at the same time. Therefore, EMC shielding may have also been considered and guaranteed here. With this solution, IM products can be filtered out from the signals to be transmitted while no or less electromagnetic interference will be radiated to the space.

In some embodiments, an AFU or RU with a small size and a low weight may be provided at a low cost when compared with any traditional product. Further, an improved PIM performance may be achieved. Furthermore, it is easy to integrate such a product with other functions.

Currently, there are a lot of RAN architectures proposed, for example, Distributed RAN (D-RAN), Centralized RAN/Cloud RAN (C-RAN), Virtual RAN (vRAN), or Open RAN (O-RAN), or the like.

In D-RAN, Radio Unit (RU)/Remote Radio Unit (RRU) and Baseband Unit (BBU) may be co-located at every cell site. Each cell site with all its radio functions may be distributed and connected back to the core network through backhaul. In C-RAN, the BBU moves to a centralized location and the cell site only has the antenna and the RU/RRU, resulting a new interface called Fronthaul between BBU and RU/RRU. This centralization of BBU functionality (also called BBU pool) results in the name C-RAN. In addition, a second option of the C-RAN architecture has a further split in BBUs into Distributed Unit (DU) and Central Unit (CU). Here, CU is further towards the core network resulting in a new interface called midhaul between DU and CU.

vRAN decouples the software from hardware by virtualizing network functions. It uses virtualization technologies such as Network Function Virtualization (NFV) or containers to deploy CU and DU over Commercial Off-The-Shelf (COTS) servers. Therefore, there is no substantial difference between vRAN and C-RAN except that traditionally C-RAN uses proprietary hardware while vRAN uses network functions on a server platform.

O-RAN takes vRAN to the next level. Traditionally, vRAN is a closed network, since RU, DU, and CU, which are all part of the RAN, must be bought from a same vendor. The O-RAN is working on specifications to open the interface between RU/RRU and DU and further between DU and CU. This means that a customer can mix and match the components from different vendors without being locked to one vendor for all these three components, thus resulting in an open RAN network.

Please note that although some embodiments will be described below in the context of one or more of the RAN architectures, the present disclosure is not limited thereto. In fact, the IM filtering according to some embodiments of the present disclosure may also be applicable to other RAN architectures than those described hereinafter.

FIG. 1 is a diagram illustrating an exemplary RAN 10 in which IM filtering according to an embodiment of the present disclosure may be applicable. As shown in FIG. 1, the RAN 10 may comprise one or more Central Units (CUs) 110, one or more Distributed Units (DUs) 120-1 and 120-2 (hereinafter, also collectively referred to as DU 120), one or more Radio Units (RUs) 130-1 through 130-6 (hereinafter, also collectively referred to as RU 130), and one or more antennas 140-1 through 140-6 (hereinafter, also collectively referred to as antenna 140). Further, one or more UEs 150-1 and 150-2 (hereinafter, also collectively referred to as UE 150) may wirelessly access the RAN 10 as shown in FIG. 1, such that they can communicate with a Core Network (CN) 105, and then further with other networks, such as the Internet.

As also shown in FIG. 1, the CU 110 may be communicatively coupled to two DUs 120-1 and 120-2, which may in turn communicatively coupled to three RUs 130-1, 130-2, 130-3 and three RUs 130-4, 130-5, 130-6, respectively. Further, each of RUs 130 may be communicatively coupled to one of the antennas 140. Although specific numbers of CUs/DUs/RUs/antennas/UEs and specific connections are shown in FIG. 1, the present disclosure is not limited thereto. In some other embodiments, any number of these entities may be present in a RAN, for example, based on the RAN operator's requirements and/or other factors. In some other embodiments, more connections, less connections, different connections may be present between the CUs/DUs/RUs/antennas/UEs.

In some embodiments, the DUs 120 may run the radio link control (RLC) and medium access control (MAC) layers in addition to a higher part of the physical layer (PHY) at a base station (BS) site. It in turn may be controlled by the CU 110. In some embodiments, the CU 110 may run the radio resource control (RRC) protocol, which conducts many functions, including information broadcasting, establishing and releasing connections between the UEs 150 and the RAN 10, and controlling the quality of service. The CU 110 may also work with the packet data convergence protocol (PDCP), which may compress and decompress IP data stream headers and transfers user data, among other technical functions. Further, the CU 110 can remain at the base station site or it can be placed at a more central aggregation site, for example, collocated with the CN 105. The DUs 120, on the other hand, may be kept at a base station that is not at an aggregation or core network location. In some embodiments, the RUs 130 may run a lower part of the PHY layer, and they may control the corresponding antennas to transmit and/or receive signals to and/or from the UEs 150.

Please note that although some exemplary implementations of antenna 140 and/or RU 130 will be described, the present disclosure is not limited thereto. For example, some embodiments of the present disclosure may also be applicable to O-RU in the O-RAN architecture. For another example, some embodiments of the present disclosure may also be applicable to RRU or Remote Radio Head (RRH). Therefore, as long as IM filtering for a digital phase shifter is involved, some embodiments of the present disclosure may be applicable.

Figure 2:
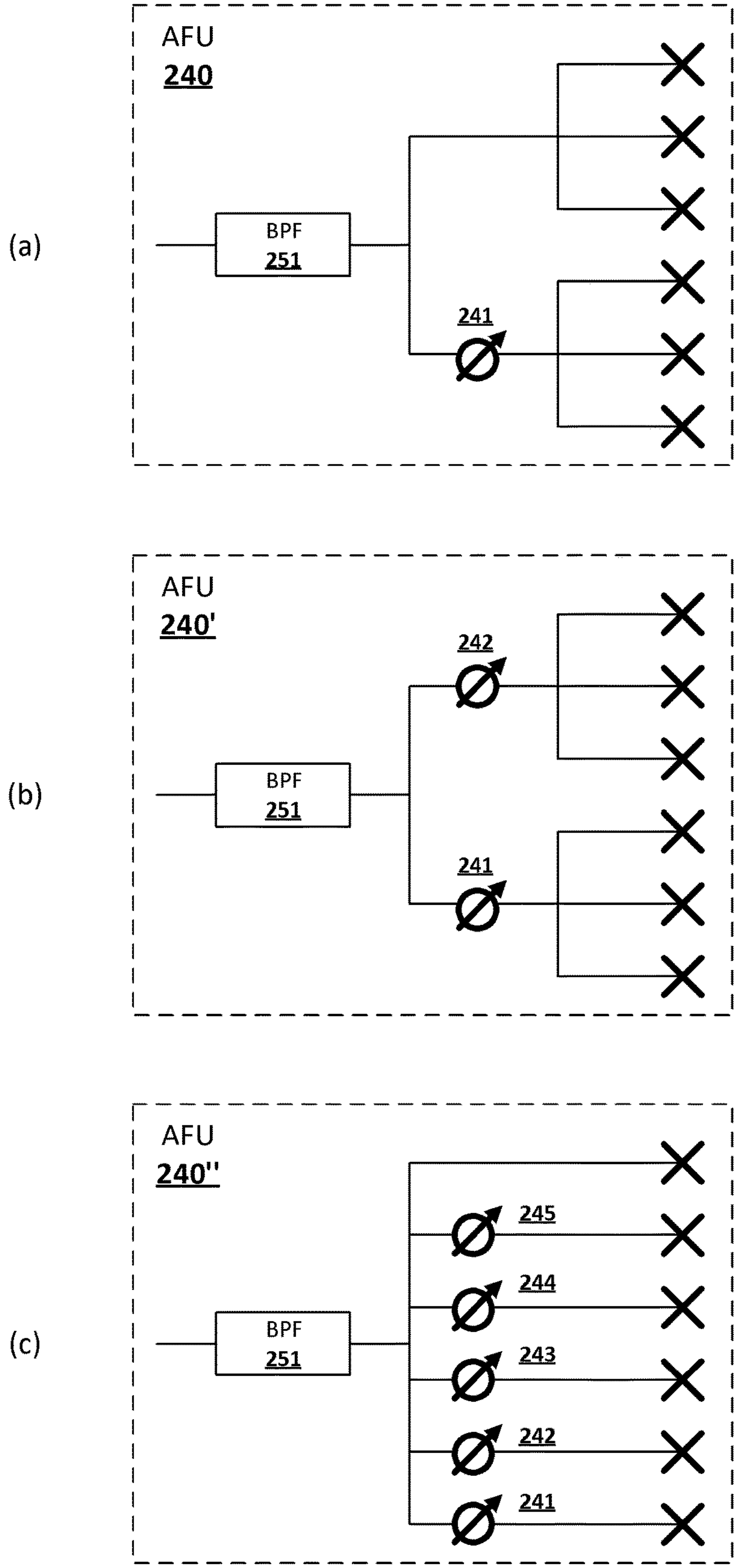
FIG. 2 is a diagram illustrating exemplary AFUs in which IM filtering according to an embodiment of the present disclosure may be applicable.

FIG. 2 is a diagram illustrating exemplary AFUs 240, 240', 240", in which IM filtering according to an embodiment of the present disclosure may be applicable. As shown in (a) of FIG. 2, a signal to be transmitted may be divided by a power divider (not shown) into multiple parts (e.g., two parts shown in (a) of FIG. 2). A first part of the signal may be propagated along the upper path without a phase shifter, and a second part may be propagated along the lower path with a digital phase shifter 241. The digital phase shifter 241 may be configured to shift a phase of the second part of the signal, such that all the parts of the signal radiated via multiple antenna elements (e.g., 6 antenna elements shown in (a) of FIG. 2) may form a desired directional beam. In this way, beamforming may be achieved. Further, a band-pass filter (BPF) 251 may be provided for band-pass filtering, such that any signal having a frequency outside of a desired operating frequency range of the antenna elements may be filtered out.

Please note that although only one BPF 251, one digital phase shifter 241, two paths, and six antenna elements are shown in (a) of FIG. 2, the present disclosure is not limited thereto. In some other embodiments, any number of BPFs, any number of digital phase shifters, any number of paths, and/or any number of antenna elements may be present in the AFU 240. For example, in the AFU 240' shown in (b) of FIG. 2, an additional digital phase shifter 242 may be provided in the upper path, such that the first part of the signal may also be phase shifted, for example, for more flexible beamforming. For another example, in the AFU 240" shown in (c) of FIG. 2, additional paths and corresponding digital phase shifters 242 through 245 may be provided for even more flexible beamforming.

Figure 3:
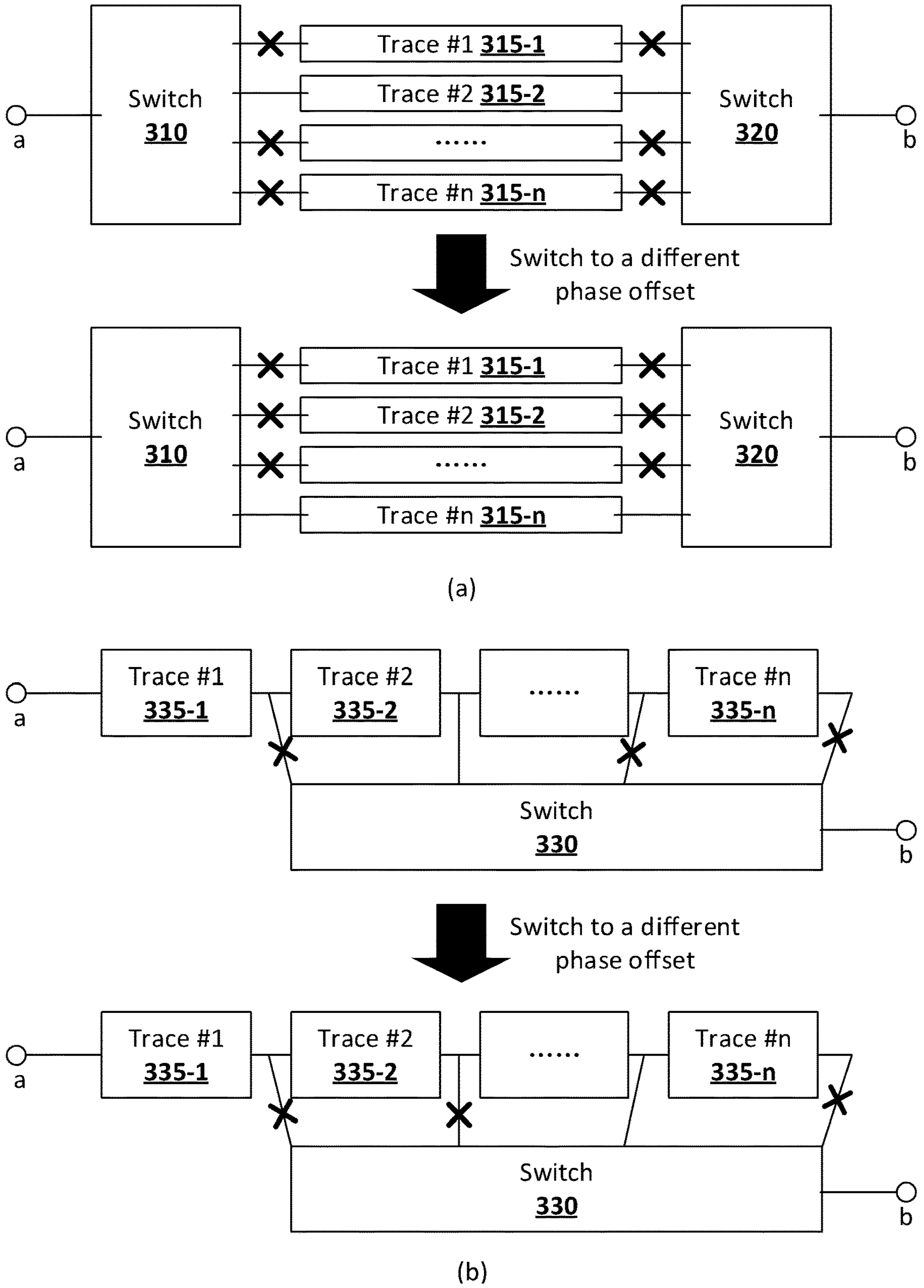
FIG. 3 is a diagram illustrating exemplary configurations of digital phase shifters with which IM filtering according to an embodiment of the present disclosure may be applicable.

FIG. 3 is a diagram illustrating exemplary configurations of digital phase shifters with which IM filtering according to an embodiment of the present disclosure may be applicable. In some embodiments, a digital phase shifter may comprise one or more switches and multiple phase shifting elements. In some embodiments, each of the phase shifting elements may be communicatively coupled to at least one of the switches and configured to shift a phase of a signal passing therethrough under the control of the at least one switch. In some embodiments, each of the phase shifting elements may be a trace.

For example, as shown in (a) of FIG. 3, a digital phase shifter may be achieved by two power switches 310 and 320 together with several traces 315-1 through **315-*n* having different lengths (or corresponding phase offsets). Under the control of the switches 310 and 320**, a signal that is input from point "a" may travel along a trace and be subjected to a corresponding phase offset or change. Therefore, when the signal travels along a different trace, its phase may be shifted by a different angle.

For example, as shown in (a) of FIG. 3, the switch 310 and switch 320 may be operated such that only the trace #2 315-2 is conductive between the point "a" (e.g., input) and the point "b" (e.g., output), and the signal passing through this digital phase shifter may be subjected to a phase change (e.g., a change of 90 degrees). After that, the switch 310 and switch 320 may be operated such that the trace #2 315-2 is not conducive any more but the trace #n **315-*n*** is conductive between "a" and "b", and the signal passing through this digital phase shifter may be subjected to another phase change (e.g., a change of 180 degrees).

In general, in some embodiments, the one or more switches may comprise a first switch (e.g., the switch 310) and a second switch (e.g., the switch 320). Further, the multiple phase shifting elements (e.g., the trace #1 315-1 through the trace #n **315-*n***) may be coupled in parallel between the first switch and the second switch, and each of the phase shifting elements may be able to shift the phase of the first signal independently of other phase shifting elements. Furthermore, the first switch and the second switch may be configured to cooperate such that only one of the phase shifting elements may be used for phase shifting the signal at a time. In some embodiments, each of the traces may have a different length than those of other traces.

For another example, as shown in (b) of FIG. 3, another digital phase shifter may be achieved by a power switches 330 together with several traces 335-1 through **335-*n*. Under the control of the switch 330, a signal that is input from point "a" may travel along one or more traces and be subjected to a corresponding phase offset or change. Therefore, when the signal travels along a different number of traces, its phase may be shifted by a different angle. Please note that the traces 335-1 through 335-*n*** may have a same length or different lengths, or some of them may have a same length but others may have one or more different lengths.

For example, as shown in (b) of FIG. 3, the switch 330 may be operated such that the trace #1 335-1 and the trace #2 335-2 are conductive between the point "a" (e.g., input) and the point "b" (e.g., output), and the signal passing through this digital phase shifter may be subjected to a phase change (e.g., a change of "45+45" degrees when each of the traces corresponds to a phase change of 45 degrees). After that, the switch 330 may be operated such that the trace #1 335-1 through the trace #(n−1) 335-(*n*−1) are conductive between "a" and "b", and the signal passing through this digital phase shifter may be subjected to another phase change (e.g., a phase change of "45*(n−1)" degrees).

In general, in some embodiments, the one or more switches may comprise a third switch (e.g., the switch 330). Further, the multiple phase shifting elements (e.g., the trace #1 335-1 through the trace #n **335-*n*) may be coupled in series and the third switch may be coupled to a reference point between each pair of consecutive phase shifting elements. Furthermore, the third switch may be configured to control the multiple phase shifting elements such that a signal that is phase shifted by a certain phase shifting element (e.g., the trace #2 335-2) is also phase shifted by all phase shifting elements (e.g., the trace #1 335-1**) that are coupled in series before the certain phase shifting element.

Please note that since a switch in a digital phase shifter (e.g., the switch 310, 320, or 330) may be directly connected with an antenna part, intermodulation products of the switch will directly go to the antenna. Therefore, IM filtering designs for AFU and RU may be needed.

Figure 4:
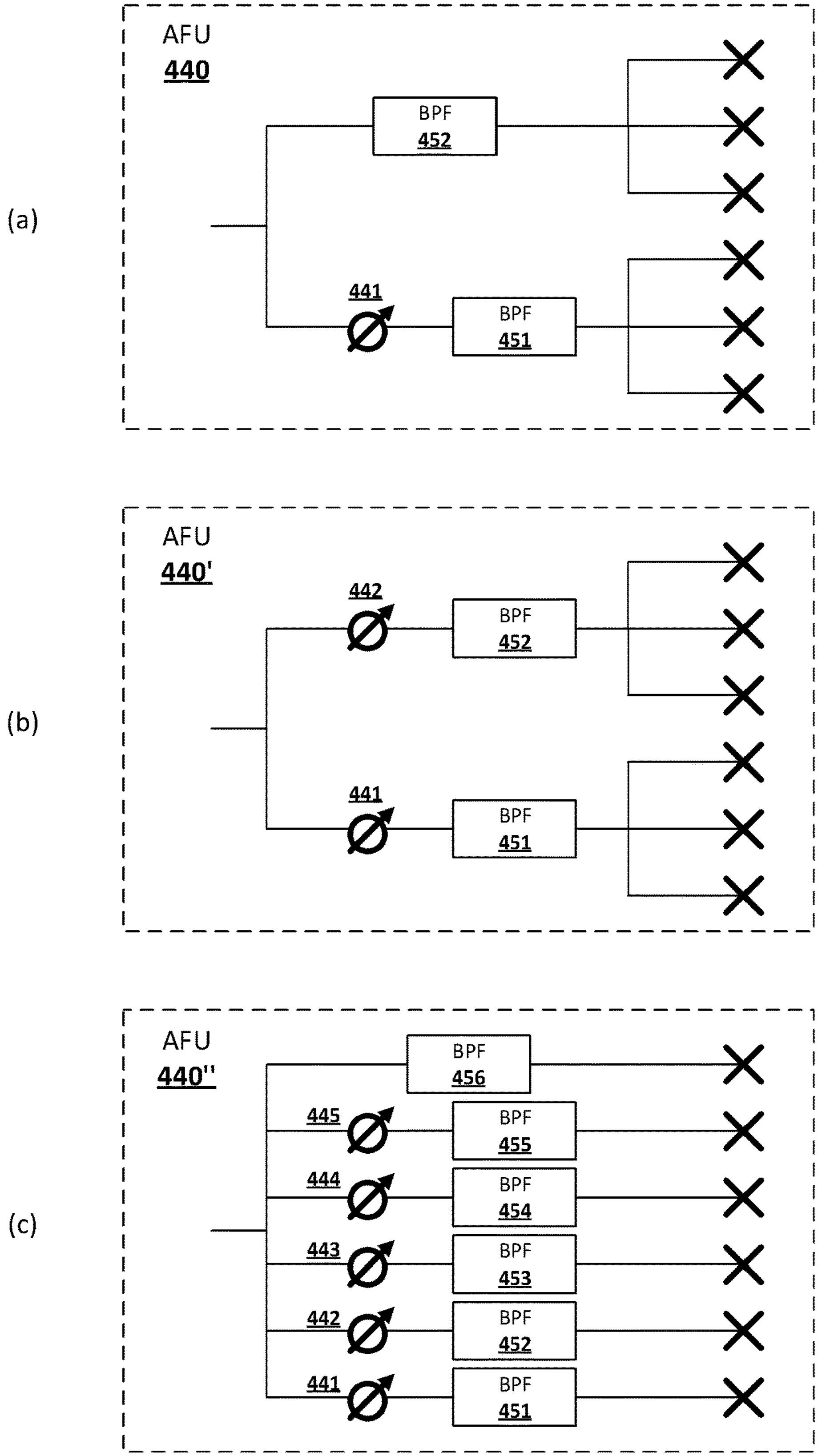
FIG. 4 is a diagram illustrating exemplary AFUs with IM filtering for digital phase shifters according to some embodiments of the present disclosure.

FIG. 4 is a diagram illustrating exemplary AFUs 440, 440', and 440" with IM filtering for digital phase shifters according to some embodiments of the present disclosure. As shown in FIG. 4, a filter may be disposed between a switch of a digital phase shifter and one or more antenna elements of an antenna, and the filter may provide rejection for the IM products from the switch.

As shown in (a) of FIG. 4, the AFU 440 may comprise one or more (e.g., 6) antenna elements, a digital phase shifter 441, and an IM filtering module 451. In some embodiments, the IM filtering module 451 may be configured to filter out any signal having a frequency outside of a desired operating frequency range of the first antenna element. In such a case, the IM filtering module 451 may also be termed as a BPF 451.

In some embodiments, the digital phase shifter 441 may be communicatively coupled to at least a first antenna element of the one or more antenna elements. For example, the digital phase shifter 441 may be communicatively coupled to the 3 antenna elements in the lower path via the BPF/IM filtering module 451, as shown in (a) of FIG. 4. In some embodiments, the digital phase shifter 441 may be configured to shift a phase of a first signal that is to be transmitted by the first antenna element. In some embodiments, the IM filtering module/BPF 451 may be communicatively coupled between the digital phase shifter 441 and the first antenna element, and configured to filter out an IM component from the first signal and output the filtered first signal. In some embodiments, the BPF/first IM filtering module 451 may be a BPF that is shown in FIG. 2.

In some embodiments, the one or more antenna elements may further comprise a second antenna element that is not communicatively coupled to any digital phase shifter. For example, the 3 antenna elements in the upper path may be the second antenna elements since any signals to be transmitted by these 3 antenna elements will not be processed and communicated from the digital phase shifter 441, as also shown in (a) of FIG. 4. In some embodiments, the second antenna element may be configured to radiate the first signal that is not phase shifted by any digital phase shifter.

In some embodiments, the AFU 440 may further comprise a BPF 452 communicatively coupled to the second antenna element. The BPF 452 may be configured to filter out any signal having a frequency outside of a desired operating frequency range of the second antenna element. In some embodiments, the first antenna element may be communicatively coupled to the IM filtering module/BPF 451 and configured to radiate the filtered first signal that is received from the IM filtering module/BPF 451. In some embodiments, the one or more antenna elements may form a phased array for beamforming.

Please note that although only two BPFs 451, 452, one digital phase shifter 441, two paths, and six antenna elements are shown in (a) of FIG. 4, the present disclosure is not limited thereto. In some other embodiments, any number of BPFs, any number of IM filtering modules, any number of digital phase shifters, any number of paths, and/or any number of antenna elements may be present in the AFU 440. For example, in the AFU 440' shown in (b) of FIG. 4, an additional digital phase shifter 442 may be provided in the upper path, such that the first part of the signal may also be phase shifted and IM filtered. For another example, in the AFU 440" shown in (c) of FIG. 4, additional paths and corresponding digital phase shifters 442 through 445 and corresponding IM filtering modules/BPFs 452 through 455 may be provided.

Figure 5:
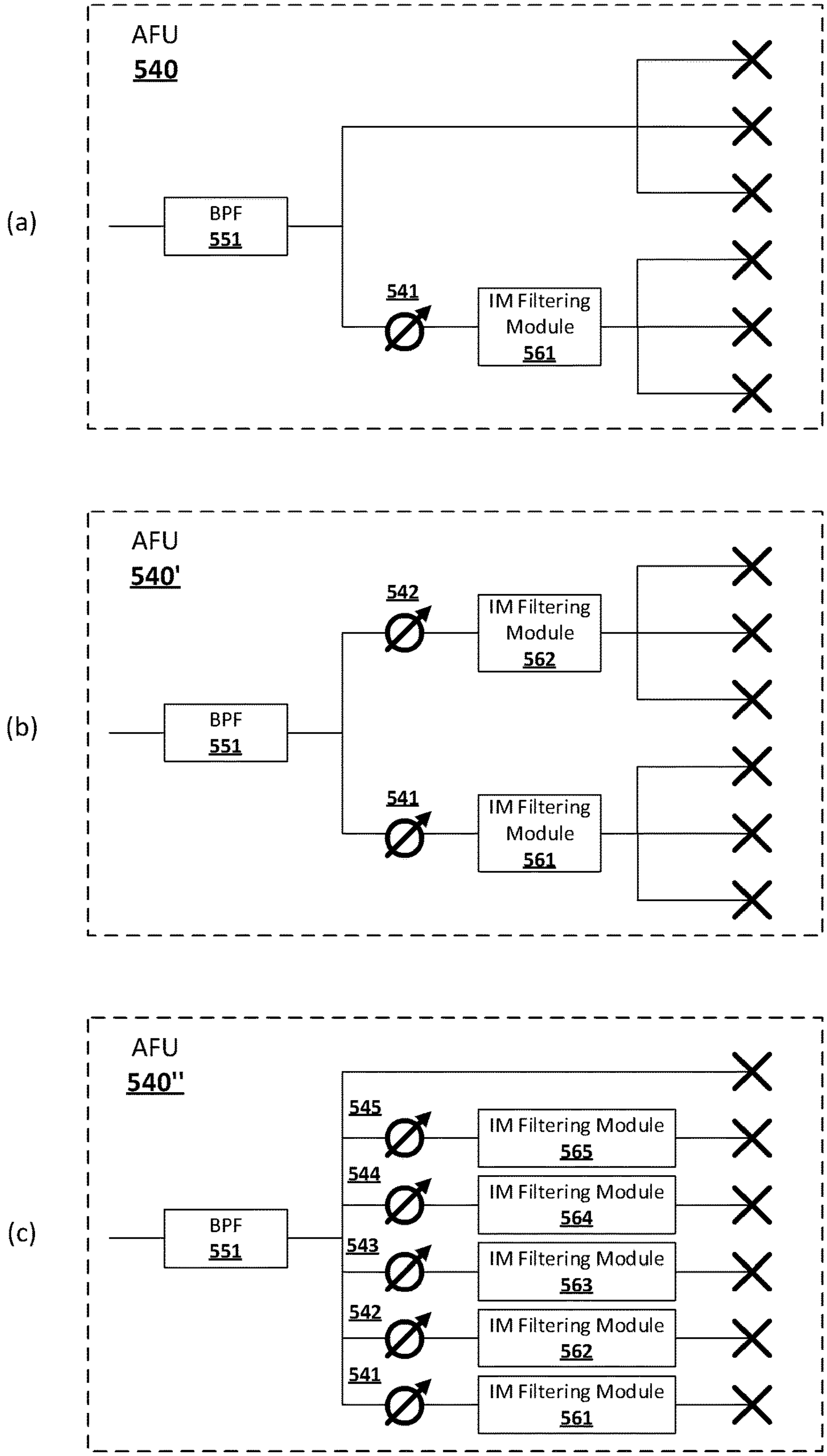
FIG. 5 is a diagram illustrating exemplary AFUs with IM filtering for digital phase shifters according to some other embodiments of the present disclosure.

FIG. 5 is a diagram illustrating exemplary AFUs 540, 540', and 540" with IM filtering for digital phase shifters according to some other embodiments of the present disclosure. As shown in (a) of FIG. 5, the AFU 540 may comprise one or more (e.g., 6) antenna elements, a digital phase shifter 541, and an IM filtering module 561. Further, the AFU 540 may further comprise a BPF 551 communicatively coupled to the digital phase shifter 541 and disposed at an upstream location relative to the digital phase shifter 541 in a transmission direction, for example, as shown in (a) of FIG. 5. The BPF 551 may be configured to filter out any signal having a frequency outside of a desired operating frequency range of the first antenna element.

When compared with (a) of FIG. 4, only one BPF 551 is provided in (a) of FIG. 5 instead of two BPFs (one for each path), because the BPF 551 is located at a place where both paths pass. However, an IM filtering module 561 is still provided since the IM product introduced by the digital phase shifter 541 is not filtered out by the BPF 551. This design is beneficial because there are multiple paths sharing the same BPF 551, for example, that shown in (c) of FIG. 5. Further, this design is beneficial especially when the IM filtering module 561 is much cheaper and/or smaller than the BPF 551 and therefore its reduced cost may justify the use of separate filters for IM filtering only.

For other parts and/or configurations of the AFU 540, they are somehow similar to those of the AFU 440, and therefore a detailed description thereof may be omitted for simplicity and clarity.

Likewise, although only one BPF 551, one digital phase shifter 541, two paths, and six antenna elements are shown in (a) of FIG. 5, the present disclosure is not limited thereto. In some other embodiments, any number of BPFs, any number of IM filtering modules, any number of digital phase shifters, any number of paths, and/or any number of antenna elements may be present in the AFU 550. For example, in the AFU 550' shown in (b) of FIG. 5, an additional digital phase shifter 542 and a corresponding IM filtering module 562 may be provided in the upper path, such that the first part of the signal may also be phase shifted and IM filtered. For another example, in the AFU 550" shown in (c) of FIG. 5, additional paths and corresponding digital phase shifters 542 through 545 and corresponding IM filtering modules 562 through 565 may be provided.

Figure 6:
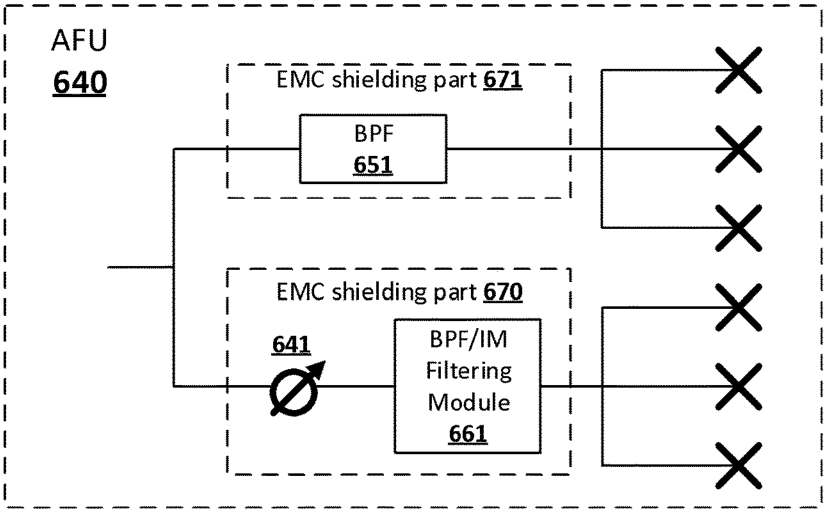
FIG. 6 is a diagram illustrating exemplary AFUs with IM filtering for digital phase shifters and with different configurations for EMC shielding according to some embodiments of the present disclosure.
Figure 6:
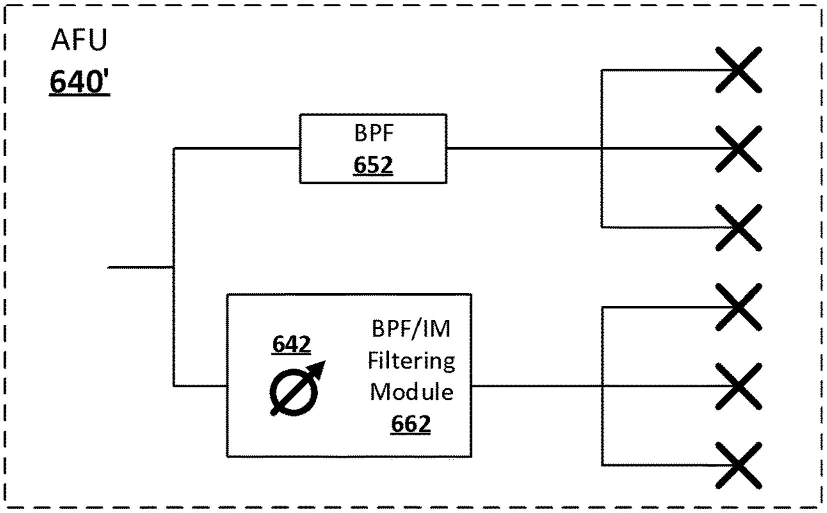
Figure 6:
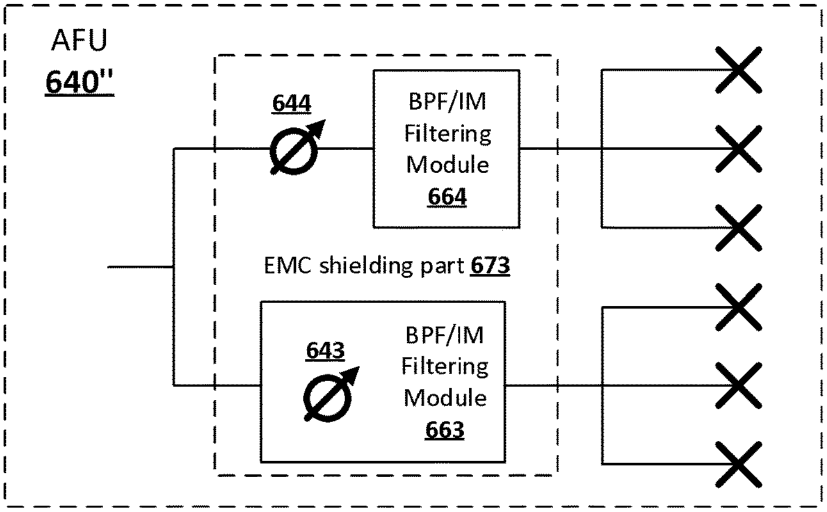

FIG. 6 is a diagram illustrating exemplary AFUs with IM filtering for digital phase shifters and with different configurations for EMC shielding according to some embodiments of the present disclosure. The embodiments shown in FIG. 6 are similar to those shown in FIG. 4 and FIG. 5 to some extent.

Further, an EMC shielding part (e.g., EMC shielding parts 670, 671, 673) may be provided for EMC shielding for digital phase shifters 641, 644, IM filtering modules 661, 664, and/or BPFs 651, 664, as shown in (a) and (c) of FIG. 6. With these EMC shielding parts, no electromagnetic interference will be radiated to the space.

Further, in some embodiments where a BPF and/or IM filtering module itself provides an EMC shielding functionality, for example, when it is a metal cavity filter, the BPF and/or IM filtering module may also house a corresponding digital phase shifter therein to provide EMC shielding for the digital phase shifter, for example, as shown in (b) of FIG. 6 and/or the BPF/IM filtering module 663 shown in (c) of FIG. 6.

In some embodiments, the IM filtering module (e.g., the BPF/IM filtering module 662) may provide EMC shielding for the digital phase shifter (e.g., the digital phase shifter 642). In some embodiments, an EMC shielding part (e.g., the EMC shielding part 670 or 673) may house both of the IM filtering module (e.g., the IM filtering module 661 or 664) and the digital phase shifter (e.g., the digital phase shifter 641 or 644) and may provide EMC shielding for both of the IM filtering module and the digital phase shifter. In some embodiments, a housing of the IM filtering module (e.g., the IM filtering module 662 or 663) may also house the digital phase shifter (e.g., the digital phase shifter 642 or 643) and may provide EMC shielding for both of the digital phase shifter and the IM filtering module.

Figure 7:
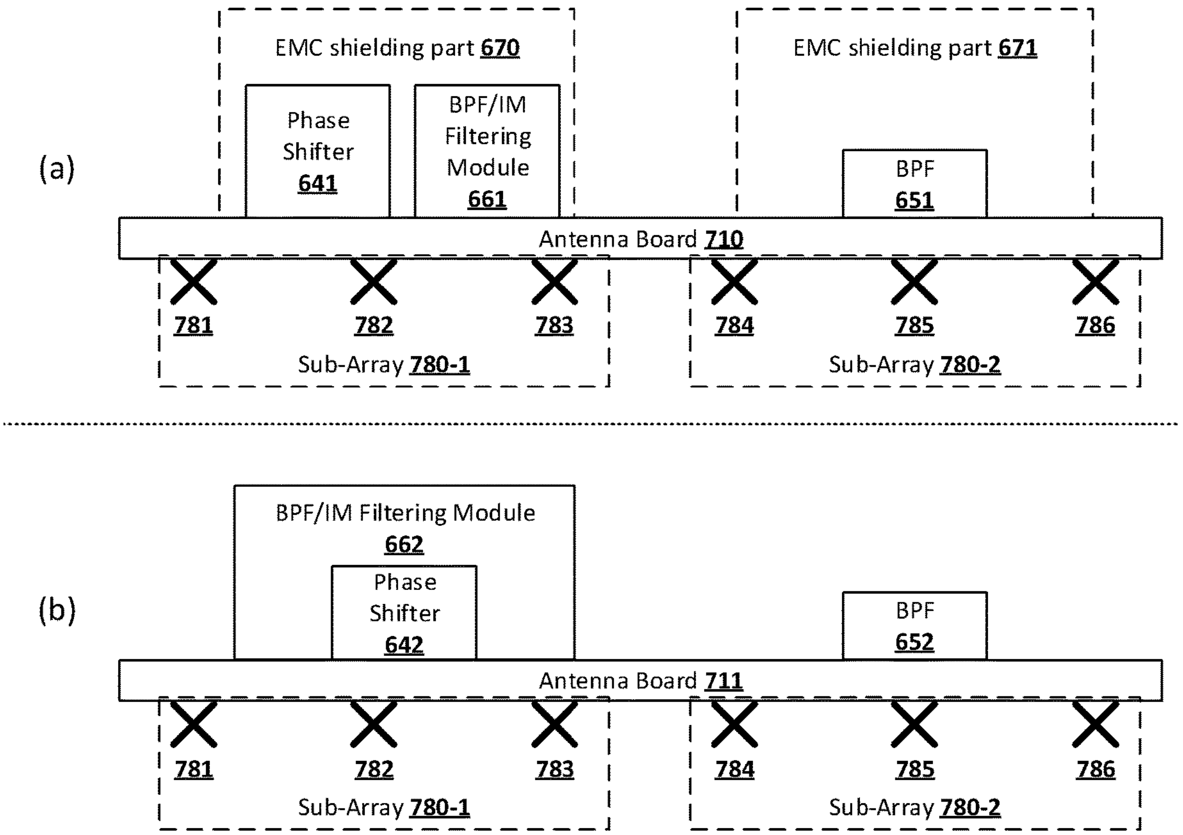
FIG. 7 is a diagram illustrating exemplary structures of AFUs according to some embodiments of the present disclosure.

FIG. 7 is a diagram illustrating exemplary structures of AFUs according to some embodiments of the present disclosure. For example, the AFU shown in (a) of FIG. 7 may be the AFU 640 shown in FIG. 6, and the AFU shown in (b) of FIG. 7 may be the AFU 640' shown in FIG. 6.

As shown in (a) of FIG. 7, the AFU 640 may further comprise an antenna board 710 on which the one or more antenna elements are disposed. Further, the digital phase shifter 641 and the IM filtering module 661 may be disposed on a surface of the antenna board 710 that is opposite to the surface on which the one or more antenna elements are disposed. In some embodiments, an EMC shielding part 670 may house both of the IM filtering module 661 and the digital phase shifter 641 and provide EMC shielding for both of the IM filtering module 661 and the digital phase shifter 641. Further, another EMC shielding part 671 may house the BPF 651 and provide EMC shielding for the BPF 651. In this embodiment, the phase shifter 641, the BPF 651, and/or the BPF/IM filtering module 661 may not provide EMC shielding for themselves, and therefore one or more EMC shielding parts 670, 671 are needed.

As shown in (a) of FIG. 7, the AFU phase shifter 641 and the BPF/IM filtering module 661 may be communicatively coupled to a sub-array 780-1 of three antenna elements 781, 782, and 783 to the left of the dashed line in a manner similar to that shown in (a) of FIG. 6. Further, as also shown in (a) of FIG. 7, the BPF 651 may be communicatively coupled to another sub-array 780-2 of three antenna elements 784, 785, and 786 to the right of the dashed line in a manner similar to that shown in (a) of FIG. 6. In this way, the signals radiated from the two sub-arrays 780-1 and 780-2 may form a desired directional beam, and therefore beamforming may be achieved.

As shown in (b) of FIG. 7, the AFU 640' may further comprise an antenna board 711 on which the one or more antenna elements are disposed. Further, the digital phase shifter 642 and the IM filtering module 662 may be disposed on a surface of the antenna board 711 that is opposite to the surface on which the one or more antenna elements are disposed. In some embodiments, a housing of the IM filtering module 662 may also house the digital phase shifter 642 and may provide EMC shielding for both of the digital phase shifter 642 and the IM filtering module 662. In this embodiment, the BPF 652 and the BPF/IM filtering module 662 may provide EMC shielding for themselves and further for the digital phase shifter 642, and therefore no separate EMC shielding part is needed.

As shown in (b) of FIG. 7, the AFU phase shifter 642 and the BPF/IM filtering module 662 may be communicatively coupled to a sub-array 780-1 of three antenna elements 781, 782, and 783 to the left of the dashed line in a manner similar to that shown in (b) of FIG. 6. Further, as also shown in (b) of FIG. 7, the BPF 652 may be communicatively coupled to another sub-array 780-2 of three antenna elements 784, 785, and 786 to the right of the dashed line in a manner similar to that shown in (b) of FIG. 6. In this way, the signals radiated from the two sub-arrays 780-1 and 780-2 may form a desired directional beam, and therefore beamforming may be achieved.

Figure 8:
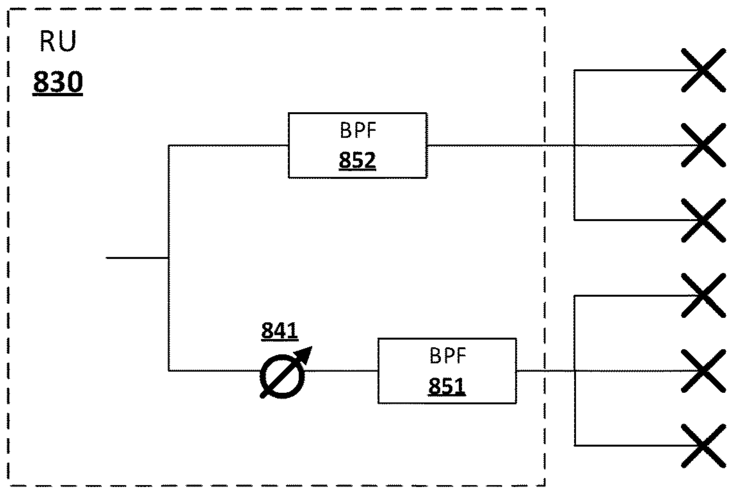
FIG. 8 is a diagram illustrating exemplary RUs with IM filtering for digital phase shifters according to some embodiments of the present disclosure.
Figure 8:
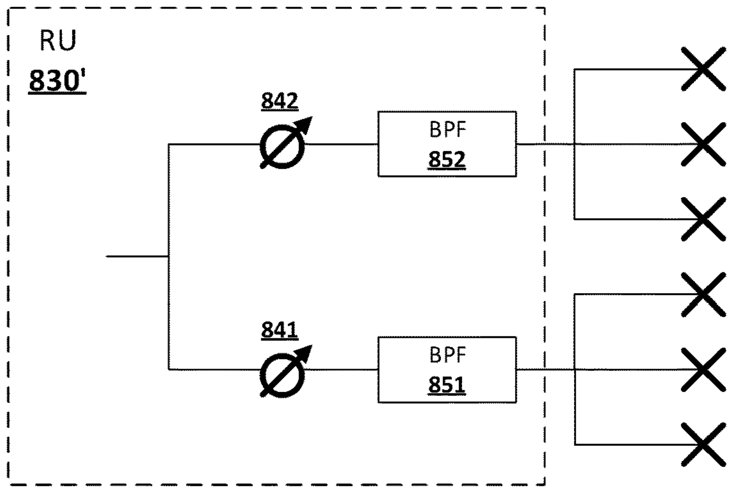
Figure 8:
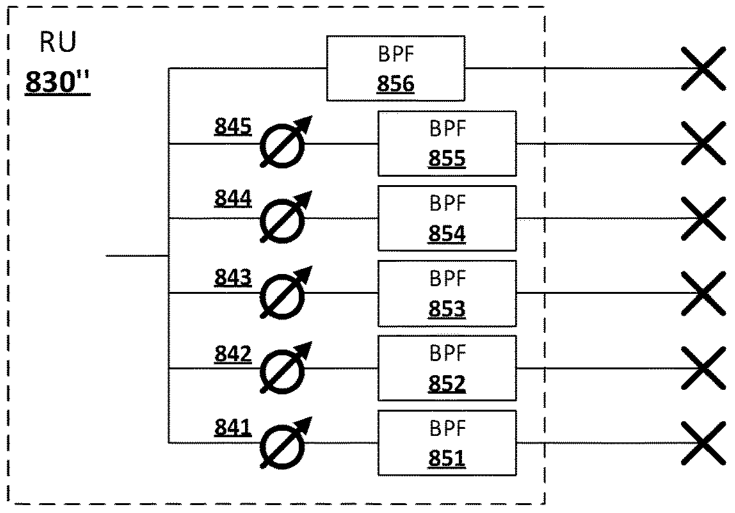

FIG. 8 is a diagram illustrating exemplary RUs 830, 830', and 830" with IM filtering for digital phase shifters according to some embodiments of the present disclosure. As shown in FIG. 8, a filter may be disposed between a switch of a digital phase shifter and one or more antenna elements of an antenna, and the filter may provide rejection for the IM products from the switch. The embodiments shown in FIG. 8 are similar to those shown in FIG. 4 with the difference that none of the RUs 830, 830', and 830" comprises any antenna element, and they may additionally comprise (but not limited to) one or more of:

an RF front end (RF FE) comprising PA, Low Noise Amplifier (LNA), Digital-to-Analog Converter (DAC), Analog-to-Digital Converter (ADC), duplexer, etc.;

a digital front end (DFE) comprising digital pre-distortion (DPD), Crest Factor Reduction (CFR), etc.;

Application Specific Integrated Circuit (ASIC)/Field Programmable Gate Array (FPGA) for lower PHY processing, for example, Fast Fourier Transform (FFT)/Inverse FFT (IFFT), Cyclic Prefix (CP) addition, etc.; and a network interface for Fronthaul transport.

However, the present disclosure is not limited thereto. In some other embodiments, the RUs 830, 830', and/or 830" may also comprise one or more antenna elements, and thus they may be known as antenna integrated radios.

Further, since the embodiments shown in FIG. 8 are similar to those shown in FIG. 4 to some extent, and therefore a detailed description thereof may be omitted for simplicity and clarity.

Figure 9:
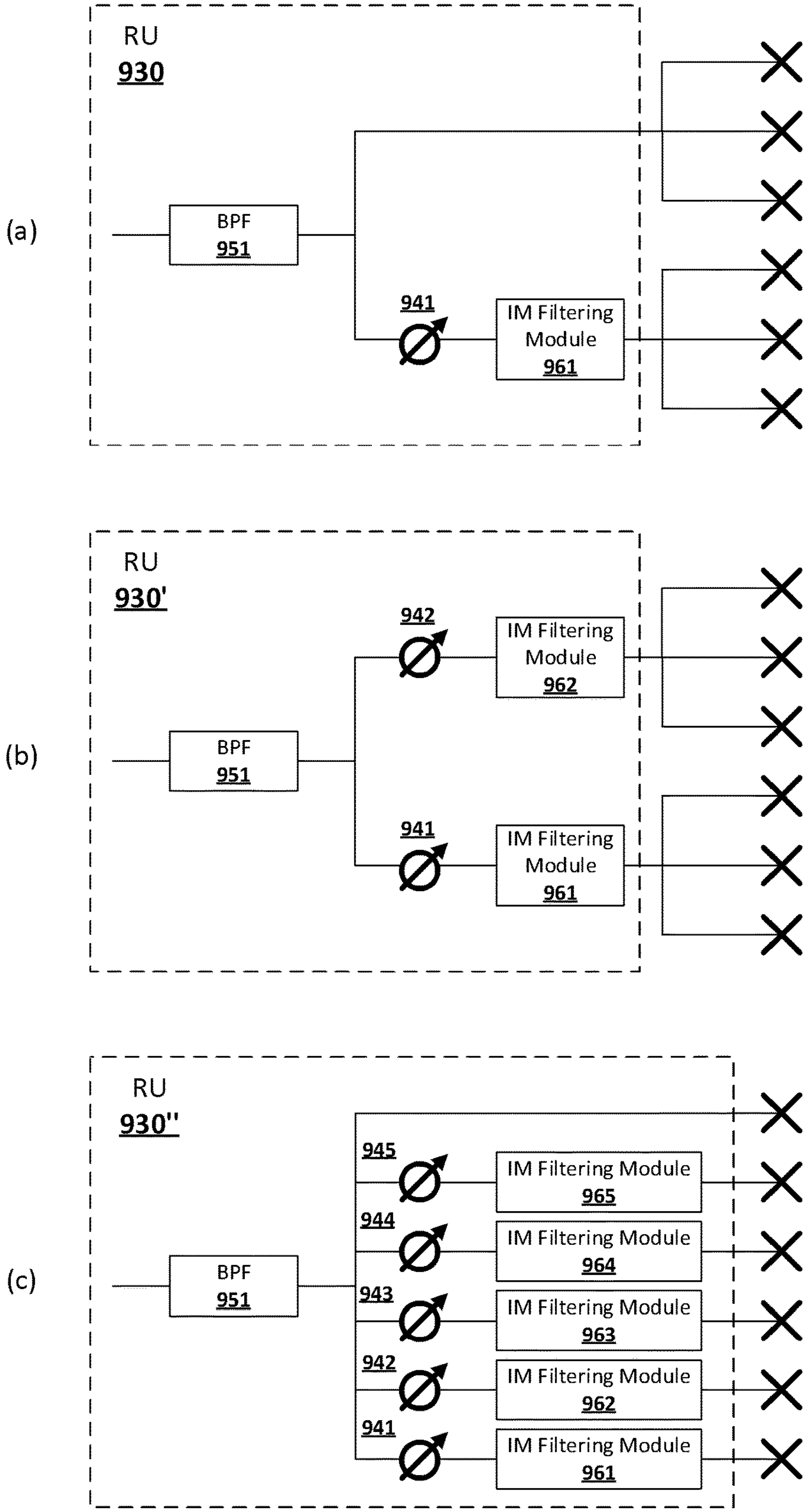
FIG. 9 is a diagram illustrating exemplary RUs with IM filtering for digital phase shifters according to some other embodiments of the present disclosure.

FIG. 9 is a diagram illustrating exemplary RUs 930, 930', and 930" with IM filtering for digital phase shifters according to some other embodiments of the present disclosure. The embodiments shown in FIG. 9 are similar to those shown in FIG. 5 with the difference that none of the RUs 930, 930', and 930" comprises any antenna element, and they may comprise (but not limited to) one or more of:

an RF FE comprising PA, LNA, DAC, ADC, duplexer, etc.;

a DFE comprising DPD, CFR, etc.;

ASIC/FPGA for lower PHY processing, for example, FFT/IFFT, CP addition, etc.; and a network interface for Fronthaul transport.

However, the present disclosure is not limited thereto. In some other embodiments, the RUs 930, 930', and/or 930" may also comprise one or more antenna elements, and thus they may be known as antenna integrated radios.

Further, since the embodiments shown in FIG. 9 are similar to those shown in FIG. 5 to some extent, and therefore a detailed description thereof may be omitted for simplicity and clarity.

Figure 10:
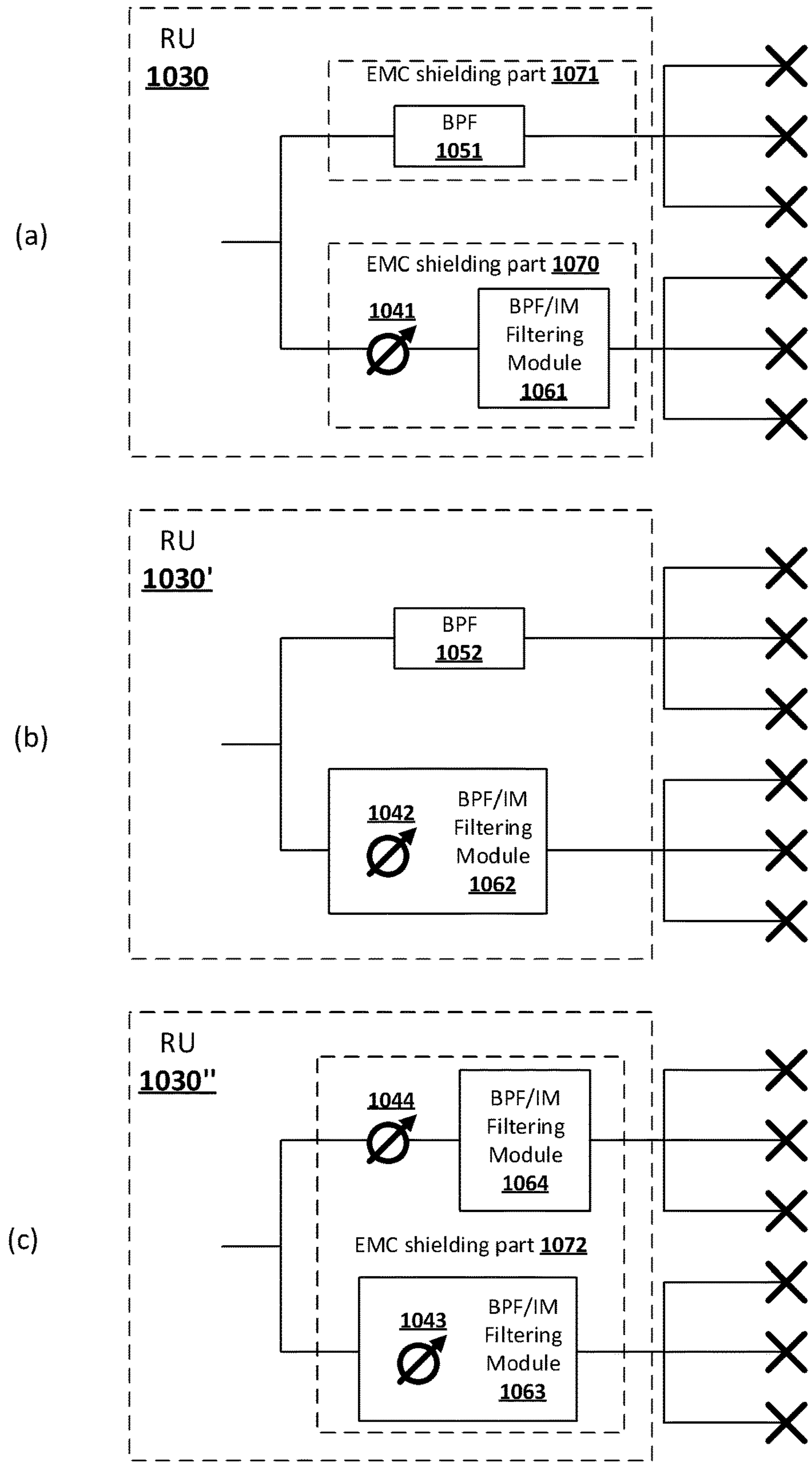
FIG. 10 is a diagram illustrating exemplary RUs with IM filtering for digital phase shifters and with different configurations for EMC shielding according to some embodiments of the present disclosure.

FIG. 10 is a diagram illustrating exemplary RUs with IM filtering for digital phase shifters and with different configurations for EMC shielding according to some embodiments of the present disclosure. The embodiments shown in FIG. 10 are similar to those shown in FIG. 6 with the difference that none of the RUs 1030, 1030', and 1030" comprises any antenna element, and they may comprise (but not limited to) one or more of:

an RF FE comprising PA, LNA, DAC, ADC, duplexer, etc.;

a DFE comprising DPD, CFR, etc.;

ASIC/FPGA for lower PHY processing, for example, FFT/IFFT, CP addition, etc.; and a network interface for Fronthaul transport.

However, the present disclosure is not limited thereto. In some other embodiments, the RUs 1030, 1030', and/or 1030" may also comprise one or more antenna elements, and thus they may be known as antenna integrated radios.

Further, since the embodiments shown in FIG. 10 are similar to those shown in FIG. 6 to some extent, and therefore a detailed description thereof may be omitted for simplicity and clarity.

Figure 11A:
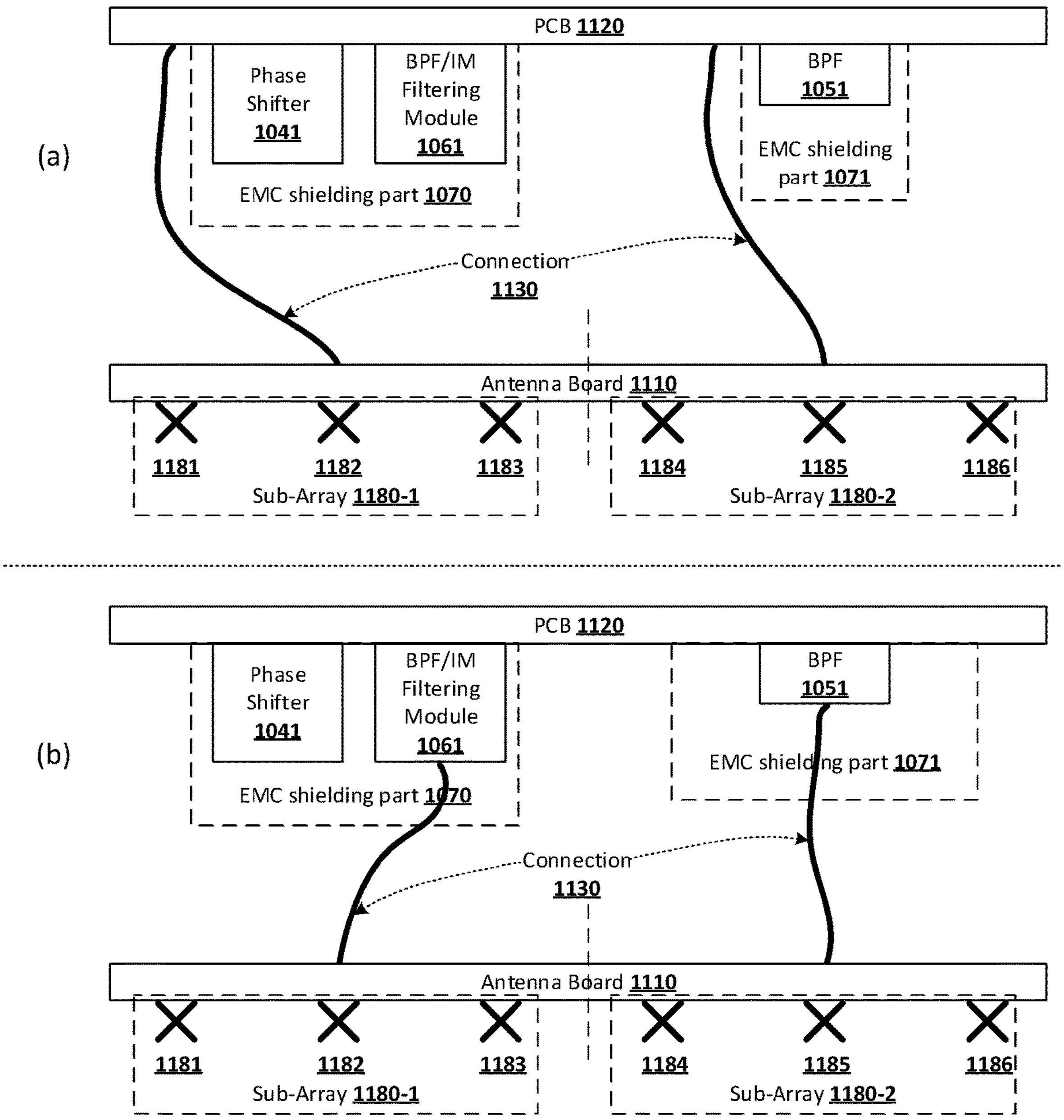
FIG. 11A and FIG. 11B are diagrams illustrating exemplary structures of RUs according to some embodiments of the present disclosure.
Figure 11B:
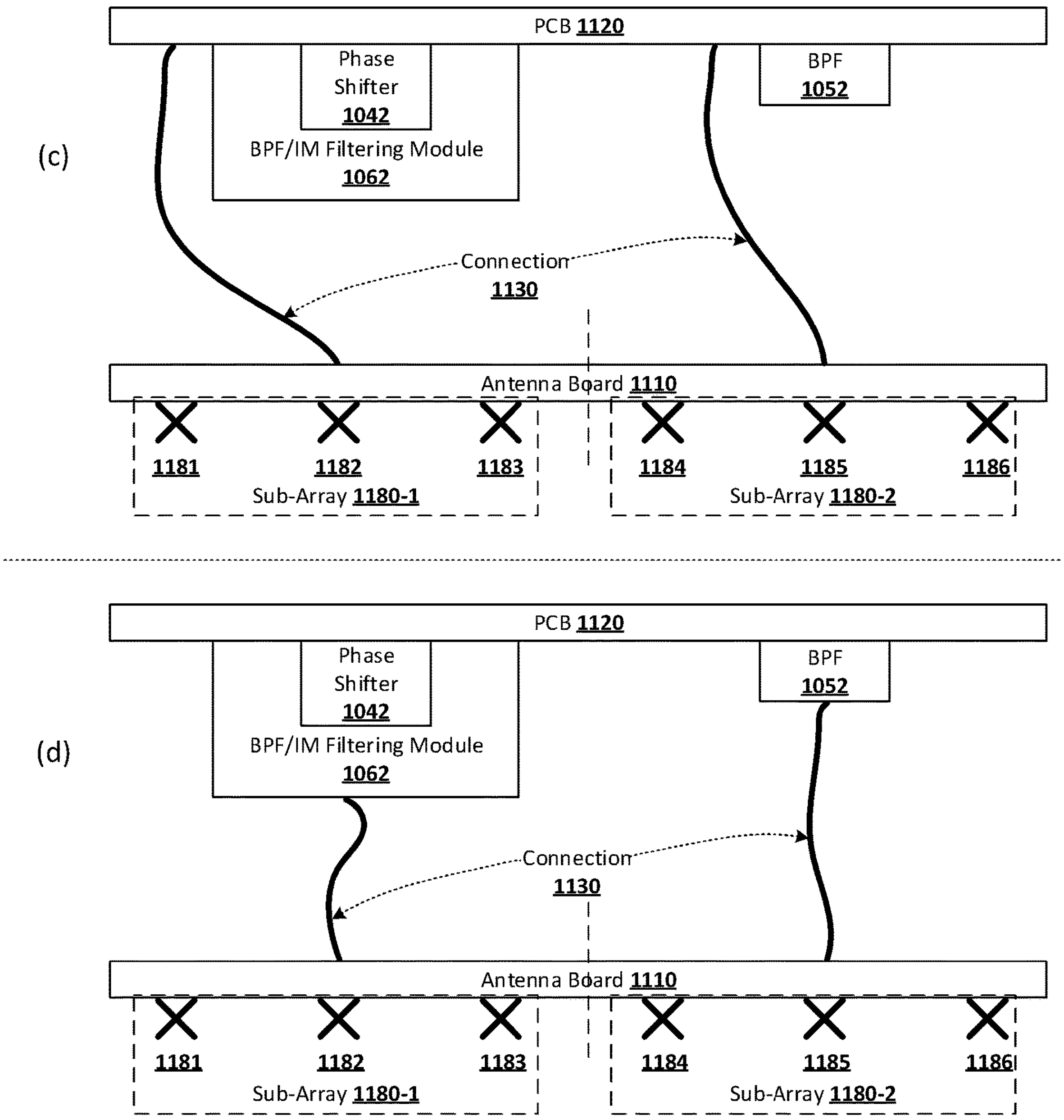

FIG. 11A and FIG. 11B are diagrams illustrating exemplary structures of RUs according to some embodiments of the present disclosure. For example, the RUs shown in (a) and (b) of FIG. 11A may be the RU 1030 shown in FIG. 10, and the RUs shown in (c) and (d) of FIG. 11B may be the RU 1030' shown in FIG. 10.

As shown in (a) and (b) of FIG. 11A, the RU 1030 may further comprise an antenna board 1110 on which the one or more antenna elements are disposed. In some embodiments, the digital phase shifter 1041 and the IM filtering module 1061 may be disposed on a PCB 1120 that is separated from the antenna board 1110 on which the one or more antenna elements are disposed. In some embodiments, an EMC shielding part 1070 may house both of the IM filtering module 1061 and the digital phase shifter 1041 and may provide EMC shielding for both of the IM filtering module 1061 and the digital phase shifter 1041. Further, another EMC shielding part 1071 may house the BPF 1051 and may provide EMC shielding for the BPF 1051.

As shown in (a) and (b) of FIG. 11A, the RU 1030 may further comprise one or more connections 1130 that are communicatively coupled between the antenna board 1110 and the PCB 1120, such that the digital phase shifter 1041 and/or the IM filtering module 1061 can communicate with a sub-array 1180-1 of three antenna elements 1181, 1182, and 1183 to the left of the dashed line via the connection 1130. In some embodiments, the connection 1130 may be disposed outside of the housing 1070 that houses the IM filtering module 1061, and communicatively coupled to the IM filtering module 1061 via a path in or on the PCB 1120, for example, as shown in (a) of FIG. 11A. In some embodiments, the connection 1130 may be disposed to penetrate through the housing 1170 that houses the IM filtering module 1061 and contact the IM filtering module 1061, and communicatively coupled to the IM filtering module 1061 directly, for example, as shown in (b) of FIG. 11A.

As shown in (c) and (d) of FIG. 11B, the RU 1030' may further comprise an antenna board 1110 on which the one or more antenna elements are disposed. In some embodiments, the digital phase shifter 1042 and the IM filtering module 1062 may be disposed on a PCB 1120 that is separated from the antenna board 1110 on which the one or more antenna elements are disposed. In some embodiments, a housing of the IM filtering module 1062 may also house the digital phase shifter 1042 and may provide EMC shielding for both of the digital phase shifter 1042 and the IM filtering module 1062. Further, the BPF 1052 may provide EMC shielding for itself.

As shown in (c) and (d) of FIG. 11B, the RU 1030' may further comprise one or more connections 1130 that are communicatively coupled between the antenna board 1110 and the PCB 1120, such that the digital phase shifter 1042 and/or the IM filtering module 1062 can communicate with a sub-array 1180-1 of three antenna elements 1181, 1182, and 1183 to the left of the dashed line via the connection 1130. In some embodiments, the connection 1130 may be disposed outside of the housing that houses the IM filtering module 1062, and communicatively coupled to the IM filtering module 1062 via a path in or on the PCB 1120, for example, as shown in (c) of FIG. 11B. In some embodiments, the connection 1130 may be disposed to contact the housing of the IM filtering module 1062, and communicatively coupled to the IM filtering module 1062 directly, for example, as shown in (d) of FIG. 11B.

Further, as shown in FIG. 11A and FIG. 11B, another connection 1130 may be provided for communicatively coupling the BPF 1051/1052 to its corresponding sub-array 1180-2 of antenna elements (e.g., three antenna elements 1184, 1185, and 1186 to the right of the dashed line shown in FIG. 11A and FIG. 11B), such that the BPF 1051/1052 may communicate with its corresponding sub-array 1180-2 of the antenna elements 1184, 1185, and 1186. In this way, the signals radiated from the two sub-arrays 1180-1 and 1180-2 may form a desired directional beam, and therefore beamforming may be achieved. In some embodiments, the multiple connections 1130 may be separately provided, or they may be bundled together but isolated to each other. In some embodiments, the connections 1130 may comprise (but not limited to) at least one of a cable, a connector, a contact, or any other connection that communicatively couples a BPF/IM filtering module to corresponding antenna elements.

As mentioned earlier, the RET technology may be used to realize the beam scan function, and the RET technology may be achieved by using one or more phase shifters. As also mentioned earlier, a phase shifter may be a digital phase shifter, for example, those shown in FIG. 3. Further, a phase shifter may also be an analog phase shifter that provides a continuously variable phase.

For example, an analog phase shifter may comprise two components, a fixed component and a slidable component. In some embodiments, two parallel micro-strip lines may be provided on the fixed component, and the ground may be provided beside the micro-strip lines. Further, a U-shaped micro-strip line may be provided on one side of the sliding component, and a whole piece of copper may be provided on the other side. The distance between the whole piece of copper and the U-shaped micro-strip line may be ¼ wavelength. The sliding component may cover the micro-strip line and the whole piece of copper with an insulating film. When the fixed component and the sliding component are overlapped to each other, the U-shaped micro-strip lines on the sliding component may be electrically connected to the two micro-strip lines on the fixed component, and the whole piece of copper on the sliding component may be connected to the micro-strip lines on the fixed component and the ground. Because the whole piece of copper on the sliding component may electrically connect the micro-strip line on the fixed component to the ground, and the distance between the whole piece of copper on the sliding component and the U-shaped micro-strip line is about a quarter wavelength, so when the phase shifter works, the energy flows from one micro-strip line on the fixed component, through the U-shaped micro-strip line on the sliding component and then flows out from another micro-strip line. When the sliding component slides, for example, when it is driven by a motor, the length of the path through which energy flows may be changed, and the phase may be changed accordingly. Please note that the analog phase shifter is not limited to that described above.

Figure 12:
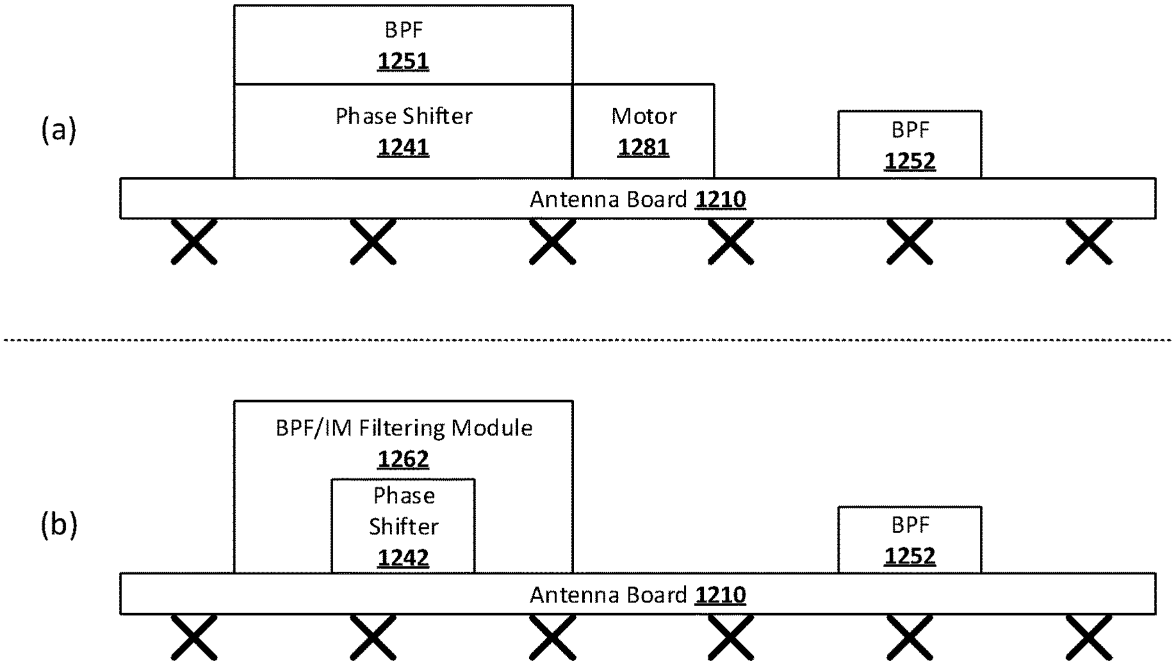
FIG. 12 is a diagram illustrating exemplary structures of an AFU with an analog phase shifter and an AFU with a digital phase shifter according to some embodiments of the present disclosure.

FIG. 12 is a diagram illustrating exemplary structures of an AFU with an analog phase shifter and an AFU with a digital phase shifter according to some embodiments of the present disclosure. As shown in (a) of FIG. 12, an AFU with an analog phase shifter may comprise a phase shifter 1241, a BPF 1251, a motor 1281 for driving the phase shifter 1241 to change its phase, and another BPF 1252. Since both the mechanical parts of the phase shifter 1241 and the motor 1281 may need a large space, the filter 1251 and the tilting part (1241/1281) may need two different layers, and therefore the AFU with an analog phase shifter may have a large size.

By contrast, as shown in (b) of FIG. 12, an AFU with a digital phase shifter may comprise a digital phase shifter 1242, a BPF/IM filtering module 1262 that houses the digital phase shifter 1242 therein, and a BPF 1252. Due to its digital phase shifter, it is smaller than that shown in (a) of FIG. 12, and the digital phase shifter 1242 may share a same layer with the filter 1262, and/or use the filter 1262 as its EMC shielding part directly. Therefore, a comparison of (a) and (b) of FIG. 12 may show an obvious benefit in size and weight. The building practice of this radio system based on (b) is much smaller than (a).

In some embodiments of the present disclosure, a system with antenna, filter, and digital RET may be provided, which may have improved PIM performance. Further, in some embodiments of the present disclosure, the filter may be disposed between the digital RET and antenna element, which may provide rejection of the PIM intermodulation products of the power switch. Further, in some embodiments of the present disclosure, the filter may share same EMC shielding parts with the digital RET. Further, in some embodiments of the present disclosure, the filter itself may provide the EMC shielding for the digital RET. Further, in some embodiments of the present disclosure, the RET may be designed as a part of the filter. Further, in some embodiments of the present disclosure, an AFU system with digital RET and an AAS radio system with this kind of AFU may be provided. Further, in some embodiments of the present disclosure, an AAS radio system of the above embodiments may be provided.

Figure 13:
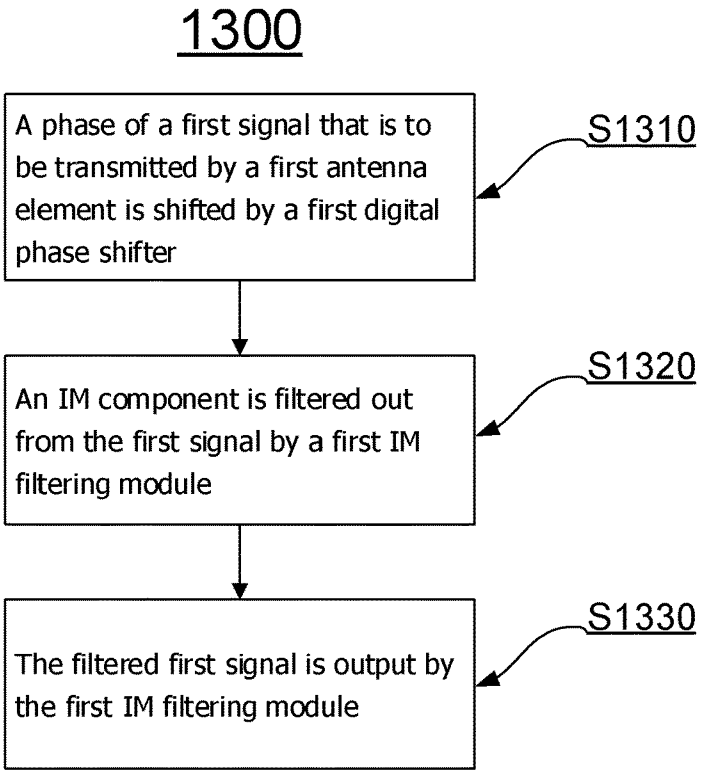
FIG. 13 is a flow chart illustrating an exemplary method of operating an AFU or an RU according to an embodiment of the present disclosure.

FIG. 13 is a flow chart of an exemplary method 1300 at an AFU or RU for IM filtering according to an embodiment of the present disclosure. The method 1300 may be performed at an AFU or RU. The method 1300 may comprise steps S1310, S1320, and S1330. However, the present disclosure is not limited thereto. In some other embodiments, the method 1300 may comprise more steps, less steps, different steps, or any combination thereof. Further the steps of the method 1300 may be performed in a different order than that described herein when multiple steps are involved. Further, in some embodiments, a step in the method 1300 may be split into multiple sub-steps and performed by different entities, and/or multiple steps in the method 1300 may be combined into a single step.

The method 1300 may begin at step S1310 where a phase of a first signal that is to be transmitted by a first antenna element may be shifted by a first digital phase shifter.

At step S1320, an IM component may be filtered out from the first signal by a first IM filtering module.

At step S1330, the filtered first signal may be output by the first IM filtering module.

In some embodiments, the method 1300 may further comprise: filtering out, by a first BPF, any signal having a frequency outside of a desired operating frequency range of the first antenna element. In some embodiments, the method 1300 may further comprise: filtering out, by the first IM filtering module, any signal having a frequency outside of a desired operating frequency range of the first antenna element. In some embodiments, the method 1300 may further comprise: radiating, by a second antenna element, the first signal that is not phase shifted by any digital phase shifter. In some embodiments, the method 1300 may further comprise: filtering out, by a second BPF, any signal having a frequency outside of a desired operating frequency range of the second antenna element.

In some embodiments, the method 1300 may further comprise: radiating the filtered first signal that is received from the first IM filtering module. In some embodiments, the one or more antenna elements may form a phased array for beamforming. In some embodiments, the first IM filtering module may provide EMC shielding for the first digital phase shifter.

In some embodiments, the AFU or RU may further comprise an antenna board on which the one or more antenna elements are disposed. In some embodiments, the first digital phase shifter and the first IM filtering module may be disposed on a surface of the antenna board that is opposite to the surface on which the one or more antenna elements are disposed. In some embodiments, an EMC shielding part may house both of the first IM filtering module and the first digital phase shifter and provide EMC shielding for both of the first IM filtering module and the first digital phase shifter. In some embodiments, a housing of the first IM filtering module may also house the first digital phase shifter and provide EMC shielding for both of the first digital phase shifter and the first IM filtering module.

In some embodiments, the first digital phase shifter may comprise: one or more switches; and multiple phase shifting elements, each being communicatively coupled to at least one of the switches and configured to shift a phase of a signal passing therethrough under the control of the at least one switch. In some embodiments, the one or more switches may comprise a first switch and a second switch, wherein the multiple phase shifting elements may be coupled in parallel between the first switch and the second switch, and each of the phase shifting elements may be able to shift the phase of the first signal independently of other phase shifting elements, wherein the first switch and the second switch may be configured to cooperate such that only one of the phase shifting elements is used for phase shifting the signal at a time. In some embodiments, the one or more switches may comprise a third switch, wherein the multiple phase shifting elements may be coupled in series and the third switch is coupled to a reference point between each pair of consecutive phase shifting elements, wherein the third switch may be configured to control the multiple phase shifting elements such that a signal that is phase shifted by a certain phase shifting element may be also phase shifted by all phase shifting elements that are coupled in series before the certain phase shifting element.

In some embodiments, each of the phase shifting elements may be a trace. In some embodiments, each of the traces may have a different length than those of other traces. In some embodiments, the first IM filtering module may comprise at least one of: a metal cavity filter; a ceramic waveguide filter; a SAW filter; a BAW filter; and a FBAR filter.

In some embodiments, the AFU may further comprise: a power divider network configured to divide a signal and output the divided signals via at least two paths, the at least two paths comprising a first path to the first digital phase shifter and a second path to the second antenna element.

In some embodiments, the first digital phase shifter and the first IM filtering module may be disposed on a PCB that is separated from an antenna board on which the one or more antenna elements are disposed. In some embodiments, the RU may further comprise a connection that is communicatively coupled between the antenna board and the PCB, such that the first digital phase shifter and/or the first IM filtering module can communicate with the first antenna element via the connection.

In some embodiments, the connection may be disposed outside of the housing that houses the first IM filtering module, and communicatively coupled to the first IM filtering module via a path in or on the PCB. In some embodiments, the connection may be disposed to penetrate through the housing that houses the first IM filtering module and contact the first IM filtering module, and communicatively coupled to the first IM filtering module directly. In some embodiments, the connection may be disposed to contact the housing of the first IM filtering module, and communicatively coupled to the first IM filtering module directly.

The disclosure has been described with reference to embodiments and drawings. It should be understood that various modifications, alternations and additions can be made by those skilled in the art without departing from the spirits and scope of the disclosure. Therefore, the scope of the disclosure is not limited to the above particular embodiments but only defined by the claims as attached and equivalents thereof.

| Abbreviation | Explanation |
|---|---|
| AAS | Advanced Antenna Systems |
| AU | Antenna Unit |
| BS | Base Station |
| EMC | Electromagnetic Compatibility |
| FU | Filter Unit |
| LBS | Legacy Base Station |
| LTE | Long Term Evolution |
| NR | New Radio |
| RBS | Radio Base Station |
| RET | Remote Electrical Tilt |
| RRU | Remote Radio Unit |

What is claimed is:

1. An antenna filter unit (AFU), comprising:

one or more antenna elements;

a first digital phase shifter communicatively coupled to at least a first antenna element of the one or more antenna elements, and configured to shift a phase of a first signal that is to be transmitted by the first antenna element; and a first intermodulation (IM) filtering module communicatively coupled between the first digital phase shifter and the first antenna element, and configured to filter out an IM component from the first signal and output the filtered first signal.

2. The AFU of claim 1, further comprising:

a first band-pass filter (BPF) communicatively coupled to the first digital phase shifter and disposed at an upstream location relative to the first digital phase shifter in a transmission direction, and configured to filter out any signal having a frequency outside of a desired operating frequency range of the first antenna element.

3. The AFU of claim 1, wherein the first IM filtering module is further configured to filter out any signal having a frequency outside of a desired operating frequency range of the first antenna element.

4. The AFU of claim 2, wherein the one or more antenna elements further comprise a second antenna element that is not communicatively coupled to any digital phase shifter, and configured to radiate the first signal that is not phase shifted by any digital phase shifter.

5. The AFU of claim 3, wherein the one or more antenna elements further comprise a second antenna element that is not communicatively coupled to any digital phase shifter, and configured to radiate the first signal that is not phase shifted by any digital phase shifter.

6. The AFU of claim 5, further comprising:

a second BPF communicatively coupled to the second antenna element, and configured to filter out any signal having a frequency outside of a desired operating frequency range of the second antenna element.

7. The AFU of claim 1, wherein the first antenna element is communicatively coupled to the first IM filtering module and configured to radiate the filtered first signal that is received from the first IM filtering module.

8. The AFU of claim 1, wherein the one or more antenna elements form a phased array for beamforming.

9. The AFU of claim 1, wherein the first IM filtering module provides Electromagnetic Compatibility (EMC) shielding for the first digital phase shifter.

10. The AFU of claim 1, further comprising an antenna board on which the one or more antenna elements are disposed.

11. A radio unit (RU), comprising:

a first digital phase shifter communicatively coupled to at least a first antenna element of one or more antenna elements, and configured to shift a phase of a first signal that is to be transmitted by a first antenna element; and a first intermodulation (IM) filtering module communicatively coupled between the first digital phase shifter and the first antenna element, and configured to filter out an IM component from the first signal, and output the filtered first signal.

12. The RU of claim 11, further comprising:

a first band-pass filter (BPF) communicatively coupled to the first digital phase shifter and disposed at an upstream location relative to the first digital phase shifter in a transmission direction, and configured to filter out any signal having a frequency outside of a desired operating frequency range of the first antenna element.

13. The RU of claim 11, wherein the first IM filtering module is further configured to filter out any signal having a frequency outside of a desired operating frequency range of the first antenna element.

14. The RU of claim 12, wherein the one or more antenna elements further comprise a second antenna element that is not communicatively coupled to any digital phase shifter, and configured to radiate the first signal that is not phase shifted by any digital phase shifter.

15. The RU of claim 13, wherein the one or more antenna elements further comprise a second antenna element that is not communicatively coupled to any digital phase shifter, and configured to radiate the first signal that is not phase shifted by any digital phase shifter.

16. The RU of claim 15, further comprising:

a second BPF communicatively coupled to the second antenna element, and configured to filter out any signal having a frequency outside of a desired operating frequency range of the second antenna element.

17. The RU of claim 11, wherein the first antenna element is communicatively coupled to the first IM filtering module and configured to radiate the filtered first signal that is received from the first IM filtering module.

18. The RU of claim 11, wherein the one or more antenna elements form a phased array for beamforming.

19. The RU of claim 11, wherein the first IM filtering module provides Electromagnetic Compatibility (EMC) shielding for the first digital phase shifter.

20. The RU of claim 11, wherein the first digital phase shifter and the first IM filtering module are disposed on a printed circuit board (PCB) that is separated from an antenna board on which the one or more antenna elements are disposed.

* * * * *